US011955564B2

(12) United States Patent
Chen

(10) Patent No.: US 11,955,564 B2
(45) Date of Patent: Apr. 9, 2024

(54) METHOD FOR FABRICATING SEMICONDUCTOR DEVICE WITH SIDEWALL OXIDIZED DIELECTRIC

(71) Applicant: NANYA TECHNOLOGY CORPORATION, New Taipei (TW)

(72) Inventor: Te-Yin Chen, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 258 days.

(21) Appl. No.: 17/582,230

(22) Filed: Jan. 24, 2022

(65) Prior Publication Data

US 2022/0149195 A1 May 12, 2022

Related U.S. Application Data

(62) Division of application No. 16/751,180, filed on Jan. 23, 2020, now Pat. No. 11,302,827.

(51) Int. Cl.
| | |
|---|---|
| *H01L 29/788* | (2006.01) |
| *H01L 29/423* | (2006.01) |
| *H01L 29/49* | (2006.01) |
| *H01L 29/51* | (2006.01) |
| *H01L 29/66* | (2006.01) |
| *H01L 27/092* | (2006.01) |

(52) U.S. Cl.
CPC ...... *H01L 29/788* (2013.01); *H01L 29/42328* (2013.01); *H01L 29/4983* (2013.01); *H01L 29/512* (2013.01); *H01L 29/66825* (2013.01); *H01L 27/092* (2013.01)

(58) Field of Classification Search
CPC ........... H01L 21/02244; H01L 21/0223; H01L 21/28; H01L 21/28176; H01L 21/28247; H01L 21/823462; H01L 21/823857; H01L 21/823864; H01L 27/092; H01L 29/40; H01L 29/401; H01L 29/4983; H01L 29/51; H01L 29/512; H01L 29/6653; H01L 29/6656; H01L 29/78; H01L 29/788; H01L 29/42328; H01L 29/66825; H01L 29/40114; H01L 29/7881; H01L 29/7883; H10B 41/30
See application file for complete search history.

(56) References Cited

U.S. PATENT DOCUMENTS

| | | | | |
|---|---|---|---|---|
| 4,532,022 A | * | 7/1985 | Takasaki | H01L 29/518 427/574 |
| 5,897,354 A | * | 4/1999 | Kachelmeier | H01L 29/42324 438/981 |
| 6,025,240 A | * | 2/2000 | Chan | H01L 29/66825 438/257 |
| 6,133,096 A | * | 10/2000 | Su | H10B 41/40 438/257 |

(Continued)

*Primary Examiner* — Maliheh Malek
(74) *Attorney, Agent, or Firm* — Xuan Zhang

(57) ABSTRACT

The present application discloses a method for fabricating a semiconductor device with an oxidized intervention layer. The method includes providing a substrate; forming a tunneling insulating layer over the substrate; forming a floating gate over the tunnel oxide layer; forming a dielectric layer over the floating gate; forming a control gate over the dielectric layer; and performing a lateral oxidation process over the substrate, wherein a process temperature of the lateral oxidation process is between about 300° C. and about 600° C.

9 Claims, 36 Drawing Sheets

(56) References Cited

U.S. PATENT DOCUMENTS

| | | | | |
|---|---|---|---|---|
| 6,448,138 B1* | 9/2002 | Clementi | | H10B 69/00 257/E21.422 |
| 6,455,440 B1* | 9/2002 | Jeng | | H01L 29/40114 438/770 |
| 7,700,991 B2* | 4/2010 | Hsiao | | H01L 29/7881 438/257 |
| 9,343,537 B2* | 5/2016 | Tang | | H01L 29/66825 |
| 11,114,569 B2* | 9/2021 | Huang | | H01L 21/02236 |
| 11,121,137 B1* | 9/2021 | Chen | | H01L 21/76897 |
| 11,611,000 B2* | 3/2023 | Sakamoto | | H01L 29/42324 |
| 2003/0003673 A1* | 1/2003 | Kim | | H10B 41/40 438/315 |
| 2003/0006431 A1* | 1/2003 | Skotnicki | | H01L 29/788 257/200 |
| 2003/0185071 A1* | 10/2003 | Yoshino | | H10B 69/00 257/E21.679 |
| 2004/0033655 A1* | 2/2004 | Chuang | | H01L 29/66825 438/211 |
| 2004/0219798 A1* | 11/2004 | Chang | | H10B 12/0383 438/723 |
| 2005/0285180 A1* | 12/2005 | Mitani | | H01L 29/7885 257/E21.422 |
| 2006/0081916 A1* | 4/2006 | Sohn | | H01L 29/40114 257/E21.209 |
| 2007/0025145 A1* | 2/2007 | Mokhlesi | | H01L 29/513 257/E29.302 |
| 2008/0121887 A1* | 5/2008 | Choi | | H01L 27/12 257/E27.111 |
| 2008/0277709 A1* | 11/2008 | Lee | | H10B 12/053 257/E27.084 |
| 2008/0318377 A1* | 12/2008 | Lee | | H10B 12/053 257/E21.654 |
| 2009/0061612 A1* | 3/2009 | Chang | | H01L 29/7887 257/E21.294 |
| 2009/0065846 A1* | 3/2009 | Tsai | | H10B 69/00 257/E21.422 |
| 2010/0097854 A1* | 4/2010 | Huang | | H01L 29/7881 257/E27.103 |
| 2011/0287625 A1* | 11/2011 | Kang | | H10B 41/35 257/E21.409 |
| 2012/0306081 A1* | 12/2012 | Ishizaki | | H10N 70/8828 438/643 |
| 2013/0240978 A1* | 9/2013 | Tanaka | | H01L 29/792 257/326 |
| 2013/0248964 A1* | 9/2013 | Toratani | | H01L 29/518 257/315 |
| 2014/0061769 A1* | 3/2014 | Toratani | | H01L 29/792 438/786 |
| 2016/0293618 A1* | 10/2016 | Namkoong | | H01L 29/42328 |
| 2019/0027486 A1* | 1/2019 | Wu | | H01L 21/823437 |
| 2020/0365598 A1* | 11/2020 | Chen | | H01L 29/401 |

\* cited by examiner

METHOD FOR FABRICATING SEMICONDUCTOR DEVICE WITH SIDEWALL OXIDIZED DIELECTRIC

CROSS-REFERENCE TO RELATED APPLICATION

This application is a divisional application of U.S. Non-Provisional application Ser. No. 16/751,180 filed Jan. 23, 2020, which is incorporated herein by reference in its entirety.

TECHNICAL FIELD

The present disclosure relates to a method for fabricating a semiconductor device, and more particularly, to a method for fabricating a semiconductor device with a sidewall oxidized dielectric.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing in frequency and impact. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device comprising a substrate; a tunneling insulating layer disposed over the substrate; a floating gate disposed over the tunnel oxide layer; a lateral oxidized intervention layer disposed over the floating gate, wherein the lateral oxidized intervention layer comprises a sidewall portion and a center portion, and the sidewall portion has a greater concentration of oxygen than the center portion; and a control gate disposed over the dielectric layer.

In some embodiments, the semiconductor device further comprises a work function metal layer disposed between the control gate and the lateral oxidized intervention layer.

In some embodiments, the work function metal layer comprises titanium aluminide, zirconium aluminide, tungsten aluminide, tantalum aluminide, or hafnium aluminide.

In some embodiments, the work function metal layer comprises titanium nitride, tantalum nitride, titanium carbide, tantalum carbide, tungsten carbide, or aluminum titanium nitride.

In some embodiments, the semiconductor device further comprises a plurality of doped regions disposed in the substrate and adjacent to sides of the tunneling insulating layer.

In some embodiments, the semiconductor device further comprises a plurality of lightly-doped regions disposed in the substrate and adjacent to sides of the lateral oxidized intervention layer.

In some embodiments, the semiconductor device further comprises a plurality of diffusion regions disposed in the substrate and between adjacent pairs of the plurality of lightly-doped regions.

In some embodiments, the semiconductor device further comprises a first well region disposed in the substrate, wherein the plurality of doped regions are disposed in the first well region.

In some embodiments, the semiconductor device further comprises a second well region disposed in the substrate and separated from the first well region, wherein the control gate, the plurality of lightly-doped regions, and the plurality of diffusion regions are disposed in the second well region.

In some embodiments, the semiconductor device further comprises a plurality of memory unit spacers attached to the sidewall portion of the lateral oxidized intervention layer.

In some embodiments, the semiconductor device further comprises a memory unit capping layer disposed over the control gate.

In some embodiments, the lateral oxidized intervention layer has a thickness between 10 angstroms and about 350 angstroms.

In some embodiments, the tunneling insulating layer has a thickness different from a thickness of the lateral oxidized intervention layer, and the tunneling insulating layer is formed from a material different from that of the lateral oxidized intervention layer.

In some embodiments, the lateral oxidized intervention layer comprises a bottom lateral oxidized intervention layer disposed over the control gate, a middle lateral oxidized intervention layer disposed over the bottom lateral oxidized intervention layer, and a top lateral oxidized intervention layer disposed over the middle lateral oxidized intervention layer.

Another aspect of the present disclosure provides a method for fabricating a semiconductor device, comprising: providing a substrate; forming a tunneling insulating layer over the substrate; forming a floating gate over the tunnel oxide layer; forming a dielectric layer over the floating gate; forming a control gate over the dielectric layer; and performing a lateral oxidation process over the substrate, wherein a process temperature of the lateral oxidation process is between about 300° C. and about 600° C.

In some embodiments, a partial pressure of oxygen of the lateral oxidation process is between about 100 mTorr and about 20 atm.

In some embodiments, the lateral oxidation process transforms the dielectric layer into a lateral oxidized intervention layer comprising a sidewall portion and a center portion, and the sidewall portion has a greater concentration of oxygen than the center portion Another aspect of the present disclosure provides a semiconductor device including a substrate, a memory unit including a memory unit conductive layer disposed above the substrate and a lateral oxidized intervention layer disposed over the memory unit conductive layer, and a control unit disposed over the lateral oxidized intervention layer. The lateral oxidized intervention layer include a sidewall portion and a center portion, and the sidewall portion has a greater concentration of oxygen than the center portion.

Due to the design of the semiconductor device of the present disclosure, the dielectric constant of the lateral oxidized intervention layer may be increased. As a result, the capacitive coupling between the control unit and the memory unit conductive layer may become more effective. Therefore, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
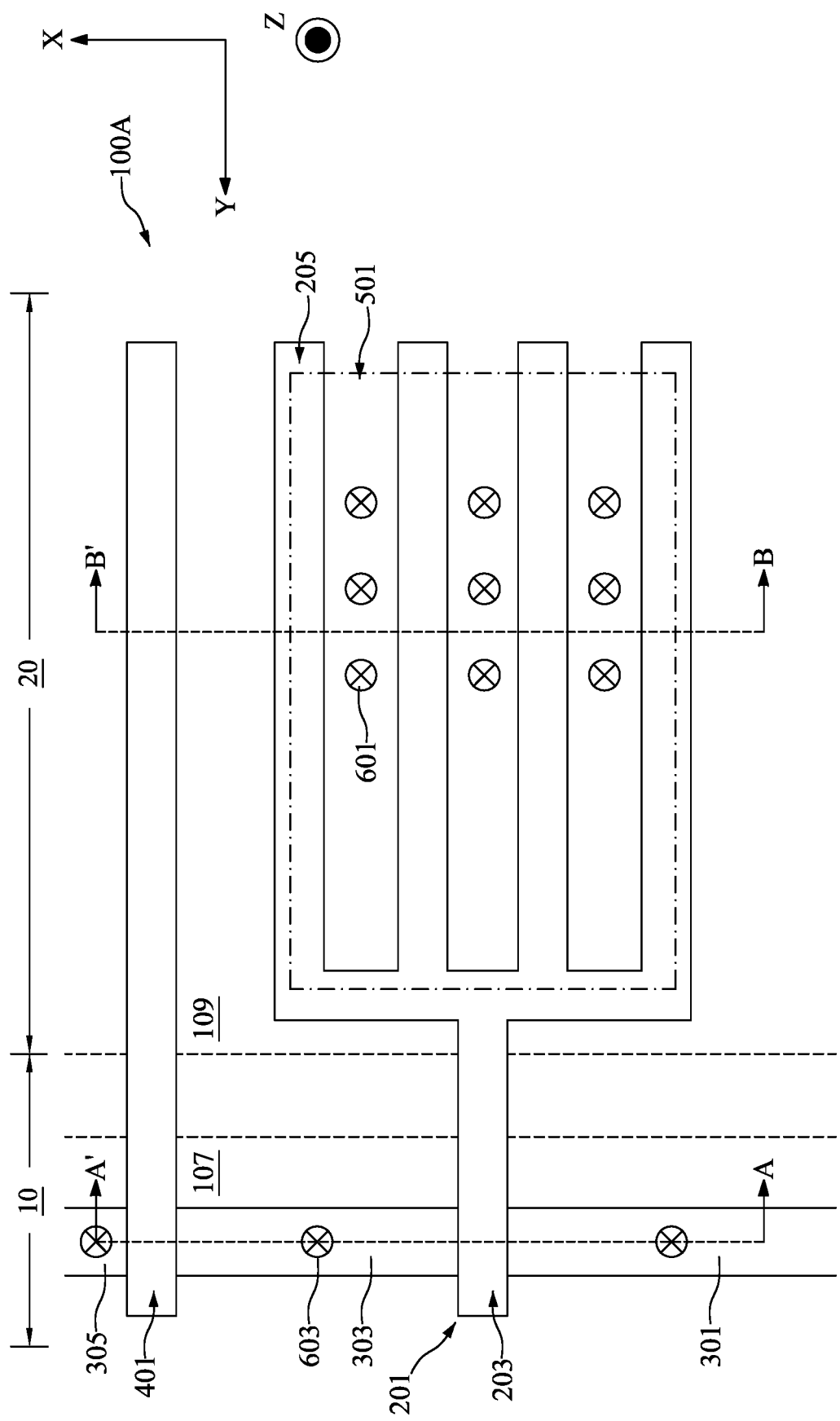
FIG. 1 illustrates, in a schematic top-view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a memory device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
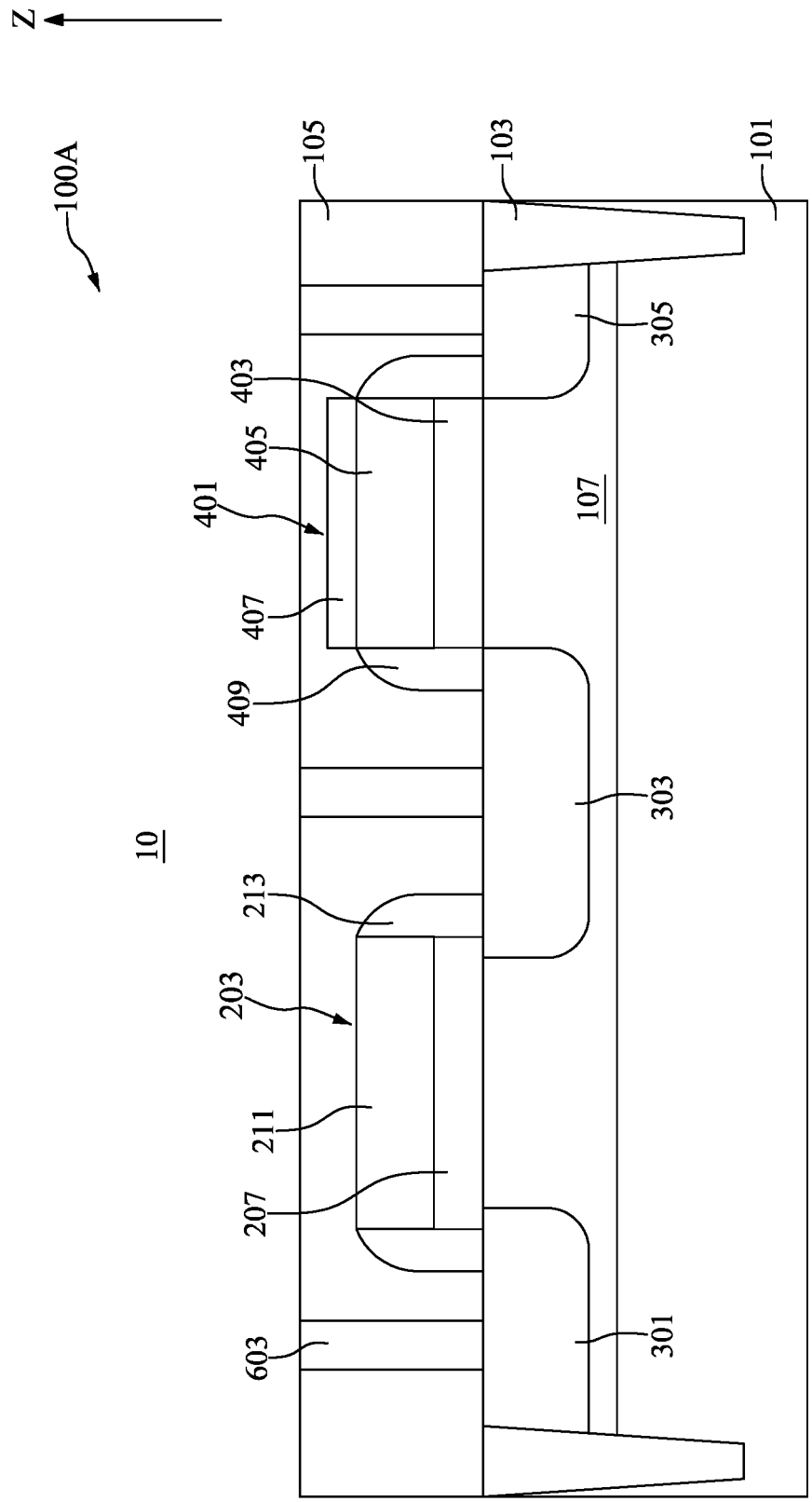
FIG. 2 is a schematic cross-sectional view diagram taken along a line A-A' in FIG. 1.
Figure 3:
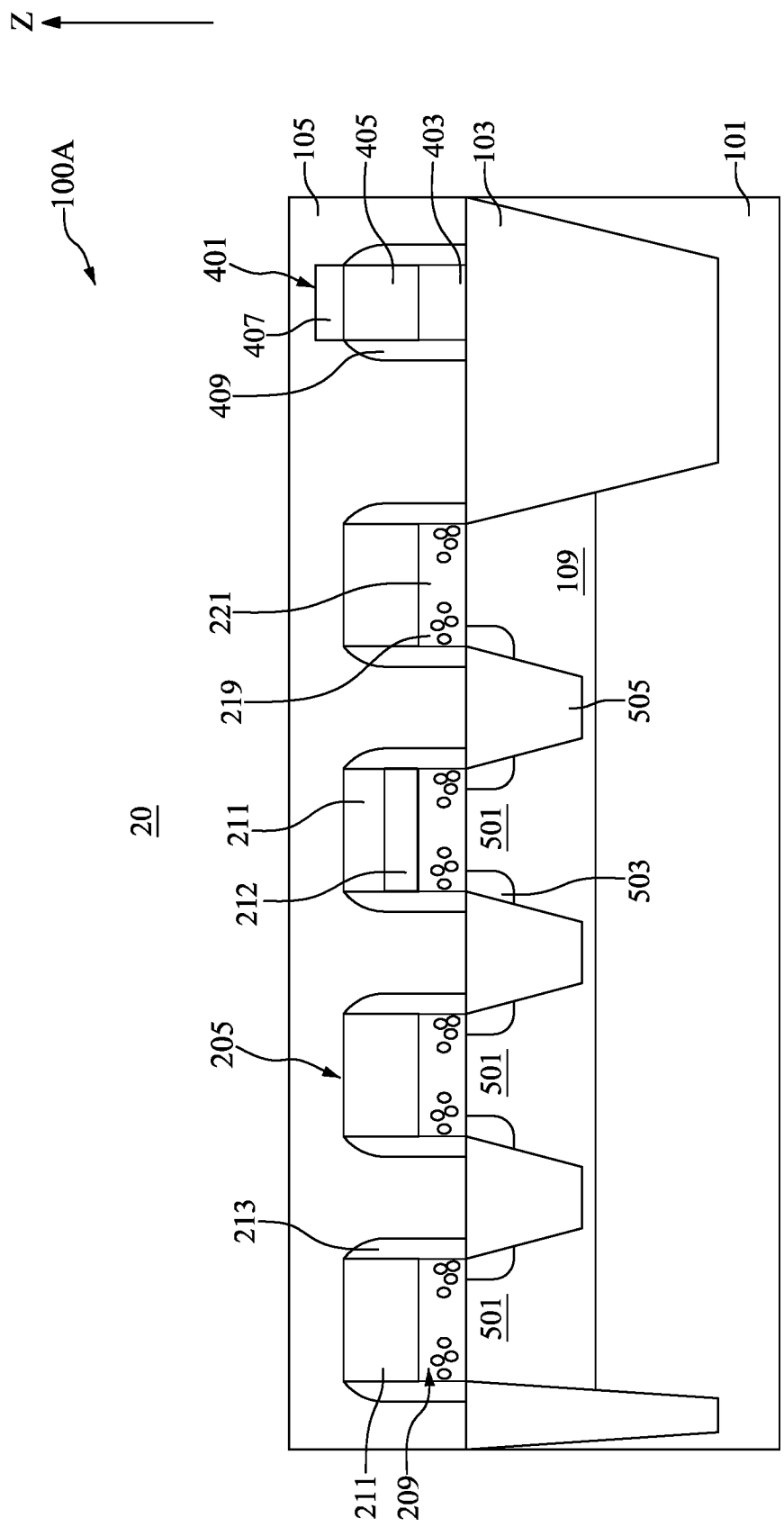
FIG. 3 is a schematic cross-sectional view diagram taken along a line B-B' in FIG. 1.

FIG. 1 illustrates, in a schematic top-view diagram, a semiconductor device 100A in accordance with one embodiment of the present disclosure. FIG. 2 is a schematic cross-sectional view diagram taken along a line A-A' in FIG. 1. FIG. 3 is a schematic cross-sectional view diagram taken along a line B-B' in FIG. 1.

With reference to FIGS. 1 to 3, in the embodiment depicted, the semiconductor device 100A may include a substrate 101, an isolation structure 103, a passivation insulating layer 105, a first well region 107, a second well region 109, a memory unit 201, a plurality of doped regions, a selection unit 401, a control unit 501, a plurality of lightly-doped regions 503, a plurality of diffusion regions 505, a plurality of control contacts 601, and a plurality of doped region contacts 603.

With reference to FIGS. 1 to 3, in the embodiment depicted, the substrate 101 may include a first area 10 and a second area 20. The second area 20 may be disposed adjacent to the first area 10. The substrate 101 may be formed of, for example, silicon, doped silicon, germanium, silicon germanium, silicon carbon, silicon germanium carbon, gallium, gallium arsenic, indium arsenic, indium phosphorus or other IV-IV, III-V or II-VI semiconductor materials. In the present embodiment, the substrate 101 may be formed of doped silicon and have a first electrical type. The substrate 101 may be doped with a dopant such as boron.

It should be noted that the first area 10 may comprise a portion of the substrate 101 and a space above the portion of the substrate 101. Describing an element as being disposed on the first area 10 means that the element is disposed on a top surface of the portion of the substrate 101. Describing an element as being disposed in the first area 10 means that the element is disposed in the portion of the substrate 101; however, a top surface of the element may be even with the top surface of the portion of the substrate 101. Describing an element as being disposed above the first area 10 means that the element is disposed above the top surface of the portion of the substrate 101. Accordingly, the second area 20 may comprise another portion of the substrate 101 and a space above the other portion of the substrate 101.

With reference to FIGS. 1 to 3, in the embodiment depicted, the first well region 107 may be disposed in the first area 10 of the substrate 101. The first well region 107 may be doped with a dopant such as phosphorus, arsenic, or antimony and have a second electrical type. The second well region 109 may be separated from the first well region 107 and may be disposed in the second area 20 of the substrate 101. The second well region 109 may be doped with a dopant such as phosphorus, arsenic, or antimony and have the second electrical type.

With reference to FIGS. 1 to 3, in the embodiment depicted, the isolation structure 103 may be disposed in the first area 10 and the second area 20 of the substrate 101. A portion of the second well region 109 may be constrained by the isolation structure 103 and may be regarded as the control unit 501. In other words, the control unit 501 may be defined by the isolation structure 103 disposed in the second area 20 of the substrate 101. The isolation structure 103 may be formed of, for example, an insulating material such as silicon oxide, silicon nitride, silicon oxynitride, silicon nitride oxide, or fluoride-doped silicate.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 1 to 3, in the embodiment depicted, the memory unit 201 may be disposed on the first area 10 and the second area 20 of the substrate 101. The memory unit 201 may include a handle portion 203, a fork portion 205, a tunneling insulating layer 207, a lateral oxidized intervention layer 209, a memory unit conductive layer 211, and a plurality of memory unit spacers 213.

With reference to FIGS. 1 to 3, in the embodiment depicted, the handle portion 203 may be disposed on the first area 10 of the substrate 101. The handle portion 203 may include the tunneling insulating layer 207 and the memory unit conductive layer 211. Specifically, a portion of the memory unit conductive layer 211, which is disposed above the first area 10, and the tunneling insulating layer 207 together form the handle portion 203 of the memory unit 201.

With reference to FIGS. 1 to 3, in the embodiment depicted, the fork portion 205 may be disposed on the second area 20 of the substrate 101. From a top-view perspective, one end of the fork portion 205 may be connected to the handle portion 203. An opposite end of the fork portion 205 may be split into four segments extended in a direction opposite to the handle portion 203 and along a first direction Y. Accordingly, four corresponding segments of the fork portion 205 are shown in a cross-sectional view in FIG. 3. The fork portion 205 may include the lateral oxidized intervention layer 209 and the memory unit conductive layer 211. Specifically, a portion of the memory unit conductive layer 211, which is disposed above the second area 20, and the lateral oxidized intervention layer 209 together form the fork portion 205.

With reference to FIGS. 1 to 3, in the embodiment depicted, the tunneling insulating layer 207 may be disposed on the first area 10 of the substrate 101. The tunneling insulating layer 207 may have a thickness between about 30 angstroms and 130 angstroms. The tunneling insulating layer 207 may be formed of, for example, silicon oxide, silicon nitride, silicon oxynitride, silicon nitride oxide, aluminum oxide, hafnium oxide, zirconium oxide, or a combination thereof. In the present embodiment, a concentration of oxygen at sidewalls of the tunneling insulating layer 207 may be equal to a concentration of oxygen at a center of the tunneling insulating layer 207. Alternatively, in another embodiment, the concentration of oxygen at the sidewalls of the tunneling insulating layer 207 may be greater than the concentration of oxygen at the center of the tunneling insulating layer 207.

With reference to FIGS. 1 to 3, in the embodiment depicted, the lateral oxidized intervention layer 209 may be disposed on the second area 20 of the substrate 101. The lateral oxidized intervention layer 209 may have a thickness different from the thickness of the tunneling insulating layer 207. The lateral oxidized intervention layer 209 may have a thickness between about 10 angstroms and about 350 angstroms. The lateral oxidized intervention layer 209 may be formed of a material different from the material of the tunneling insulating layer 207. The lateral oxidized intervention layer 209 may be formed of, for example, an insulating material having a dielectric constant of about 4.0 or greater. (All dielectric constants mentioned herein are relative to a vacuum unless otherwise noted.) The insulating material having a dielectric constant of about 4.0 or greater may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or a mixture thereof. A concentration of oxygen at sidewall portions 219 of the lateral oxidized intervention layer 209 may be greater than a concentration of oxygen at a center portion 221 of the lateral oxidized intervention layer 209.

Alternatively, in another embodiment, the lateral oxidized intervention layer 209 may have a same thickness as the tunneling insulating layer 207. The lateral oxidized intervention layer 209 may be formed of a same material as the tunneling insulating layer 207. The tunneling insulating layer 207 and the lateral oxidized intervention layer 209 may be concurrently formed in a same semiconductor process.

With reference to FIGS. 1 to 3, in the embodiment depicted, the memory unit conductive layer 211 may be disposed above the first area 10 and the second area 20 of the substrate 101. The memory unit conductive layer 211 may be respectively correspondingly disposed on the tunneling insulating layer 207 and the lateral oxidized intervention layer 209. The memory unit conductive layer 211 may be formed of, for example, polysilicon or polysilicon-germanium.

With reference to FIGS. 1 to 3, in the embodiment depicted, the plurality of memory unit spacers 213 may be disposed on the first area 10 and the second area 20 of the substrate 101. The plurality of memory unit spacers 213 may be attached to the sidewalls of the tunneling insulating layer 207, the sidewalls of the lateral oxidized intervention layer 209, and sidewalls of the memory unit conductive layer 211. The plurality of memory unit spacers 213 may be formed of, for example, silicon oxide, silicon nitride, silicon oxynitride, or silicon nitride oxide.

With reference to FIGS. 1 to 3, in the embodiment depicted, the selection unit 401 may be disposed on the first area 10 and the second area 20 of the substrate 101. The selection unit 401 may be separated from the memory unit 201 along a second direction X perpendicular to the first direction Y. The selection unit 401 may include a selection unit insulating layer 403, a selection unit conductive layer 405, a selection unit top conductive layer 407, and a plurality of selection unit spacers 409.

With reference to FIGS. 1 to 3, in the embodiment depicted, the selection unit insulating layer 403 may be disposed on the first area 10 and the second area 20 of the substrate 101. The selection unit insulating layer 403 may have a thickness between about 5 angstroms and about 50 angstroms. It should be noted that the thickness of the selection unit insulating layer 403 may be set to an arbitrary range depending on the circumstances. The selection unit insulating layer 403 may be formed of, for example, an insulating material having a dielectric constant of about 4.0 or greater. Alternatively, in another embodiment, the insulating material may be silicon oxide, silicon nitride, silicon oxynitride, silicon nitride oxide, or the like. The selection unit conductive layer 405 may be disposed above the first area 10 and the second area 20 of the substrate 101. The selection unit conductive layer 405 may be disposed on the selection unit insulating layer 403. The selection unit conductive layer 405 may have a thickness between about 150 nm and about 300 nm. The selection unit conductive layer 405 may be formed of, for example, doped polysilicon.

With reference to FIGS. 1 to 3, in the embodiment depicted, the selection unit top conductive layer 407 may be disposed above the first area 10 and the second area 20 of the substrate 101. The selection unit top conductive layer 407 may be disposed on the selection unit conductive layer 405. The selection unit top conductive layer 407 may be formed of, for example, metal silicide. The metal silicide may be nickel silicide, platinum silicide, titanium silicide, molybdenum silicide, cobalt silicide, tantalum silicide, tungsten silicide, or the like. The plurality of selection unit spacers 409 may be attached to sidewalls of the selection unit insulating layer 403 and sidewalls of the selection unit conductive layer 405. The plurality of selection unit spacers 409 may be formed of, for example, silicon oxide, silicon nitride, silicon oxynitride, or silicon nitride oxide.

With reference to FIGS. 1 to 3, in the embodiment depicted, the plurality of doped regions may be disposed in the first well region 107. The plurality of doped regions may be doped with a dopant such as boron and have the first electrical type. The plurality of doped regions may include a first doped region 301, a second doped region 303, and a third doped region 305.

With reference to FIGS. 1 to 3, in the embodiment depicted, the first doped region 301 may be disposed in the first well region 107 and adjacent to one side of the tunneling insulating layer 207. A portion of a top surface of the first doped region 301 may contact a bottom of the tunneling insulating layer 207. The second doped region 303 may be disposed in the first well region 107 and adjacent to an opposite side of the tunneling insulating layer 207. One side of the second doped region 303 may contact the bottom of the tunneling insulating layer 207. An opposite side of the second doped region 303 may be adjacent to one side of the selection unit insulating layer 403. The third doped region 305 may be disposed in the first well region 107 and adjacent to an opposite side of the selection unit insulating layer 403.

With reference to FIGS. 1 to 3, in the embodiment depicted, the control unit 501 may be disposed in the second well region 109. The control unit 501 may be disposed away from the plurality of doped regions with the isolation structure 103 and the substrate 101 having the first electrical type interposed therebetween. The control unit 501, which is disposed in a well region different from that of the plurality of doped regions, may prevent leakage current from affecting the plurality of doped regions when provided with an outer voltage source. The control unit 501 may be disposed below the lateral oxidized intervention layer 209. In other words, the control unit 501 may be disposed opposite to the memory unit conductive layer 211 with the lateral oxidized intervention layer 209 interposed therebetween. From a top-view perspective, a ratio of an area of overlap of the fork portion 205 and the control unit 501 to a surface area of the control unit 501 may be between about 20% and about 60%. With presence of the lateral oxidized intervention layer 209, although the control unit 501 only partially overlaps the memory unit 201, the control unit 501 may still induce effective capacitive coupling with the memory unit conductive layer 211 when provided with an outer voltage source.

With reference to FIGS. 1 to 3, in the embodiment depicted, the plurality of lightly-doped regions 503 may be disposed in the second area 20 of the substrate 101. The plurality of lightly-doped regions 503 may be disposed in the second well region 109 and adjacent to sides of the lateral oxidized intervention layer 209. Specifically, from a cross-sectional view, the plurality of lightly-doped regions 503 may be respectively correspondingly disposed between adjacent pairs of the four segments of the fork portion 205. Top surfaces of the plurality of lightly-doped regions 503 may contact portions of a bottom of the lateral oxidized intervention layer 209. The plurality of lightly-doped regions 503 may be doped with a dopant such as phosphorus, arsenic, or antimony and have the second electrical type. The plurality of lightly-doped regions 503 may have a dopant concentration greater than that of the second well region 109 or the control unit 501. The plurality of lightly-doped regions 503 may be electrically coupled to the control unit 501.

With reference to FIGS. 1 to 3, in the embodiment depicted, the plurality of diffusion regions 505 may be disposed in the second area 20 of the substrate 101. The plurality of diffusion regions 505 may be disposed in the second well region 109 and between the adjacent pairs of the four segments of the fork portion 205. Specifically, the plurality of diffusion regions 505 may be disposed between adjacent pairs of the plurality of lightly-doped regions 503. Portions of top surfaces of the plurality of diffusion regions 505 may contact portions of bottoms of the plurality of memory unit spacers 213. The plurality of diffusion regions 505 may be doped with a dopant such as phosphorus, arsenic, or antimony and have the second electrical type. The plurality of diffusion regions 505 may have a dopant concentration greater than that of the plurality of lightly-doped regions 503. The plurality of diffusion regions 505 may be electrically coupled to the plurality of lightly-doped regions 503 and the control unit 501.

With reference to FIGS. 1 to 3, in the embodiment depicted, the passivation insulating layer 105 may be disposed on the substrate 101. The passivation insulating layer 105 may cover the memory unit 201 and the selection unit 401. The passivation insulating layer 105 may be formed of, for example, silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, xerogel, aerogel, amorphous fluorinated carbon, organo silicate glass, parylene, bis-benzocyclobutenes, polyimide, porous polymeric material, or a combination thereof, but is not limited thereto.

With reference to FIGS. 1 to 3, in the embodiment depicted, the plurality of control contacts 601 may be disposed on the second area 20 of the substrate 101. The plurality of control contacts 601 may penetrate the passivation insulating layer 105 and may be electrically coupled to the plurality of diffusion regions 505. The plurality of control contacts 601 may be formed of, for example, doped polysilicon, metal, metal nitride, or metal silicide. The metal may be aluminum, copper, tungsten, or cobalt. A voltage may be applied to the control unit 501 through the plurality of control contacts 601, the plurality of diffusion regions 505, and the plurality of lightly-doped regions 503. The plurality of doped region contacts 603 may be disposed on the first area 10 of the substrate 101. The plurality of doped region contacts 603 may penetrate the passivation insulating layer 105 and may be electrically coupled to the plurality of doped regions. The plurality of doped region contacts 603 may be formed of, for example, doped polysilicon, metal, metal nitride, or metal silicide.

With reference to FIG. 3, in some embodiments, the semiconductor device further comprises a work function metal layer 212 disposed between the control unit 211 and the lateral oxidized intervention layer 209. In some embodiments, the work function metal layer comprises n-type work function metal such as titanium aluminide, zirconium aluminide, tungsten aluminide, tantalum aluminide, or hafnium aluminide. In some embodiments, the work function metal layer comprises p-type work function metal such as titanium nitride, tantalum nitride, titanium carbide, tantalum carbide, tungsten carbide, or aluminum titanium nitride.

In the semiconductor device 100A, electrons may be transferred to the memory unit conductive layer 211 through the tunneling insulating layer 207 by hot electron injection or Fowler-Nordheim tunneling. In either electron transfer mechanism, a voltage potential may be applied to the memory unit conductive layer 211 by capacitive coupling of the control unit 501. The control unit 501 may be capacitively coupled to the memory unit conductive layer 211 through the lateral oxidized intervention layer 209 when a voltage source, which provides the voltage potential, is applied to the control unit 501. With the presence of the lateral oxidized intervention layer 209 having a higher concentration of oxygen at the sidewall portions of the lateral oxidized intervention layer 209, the capacitive coupling between the control unit 501 and the memory unit conductive layer 211 may be more effective. As a result, the electron transfer of the semiconductor device 100A may be improved. In other words, the performance of the semiconductor device 100A may be improved.

Figure 4:
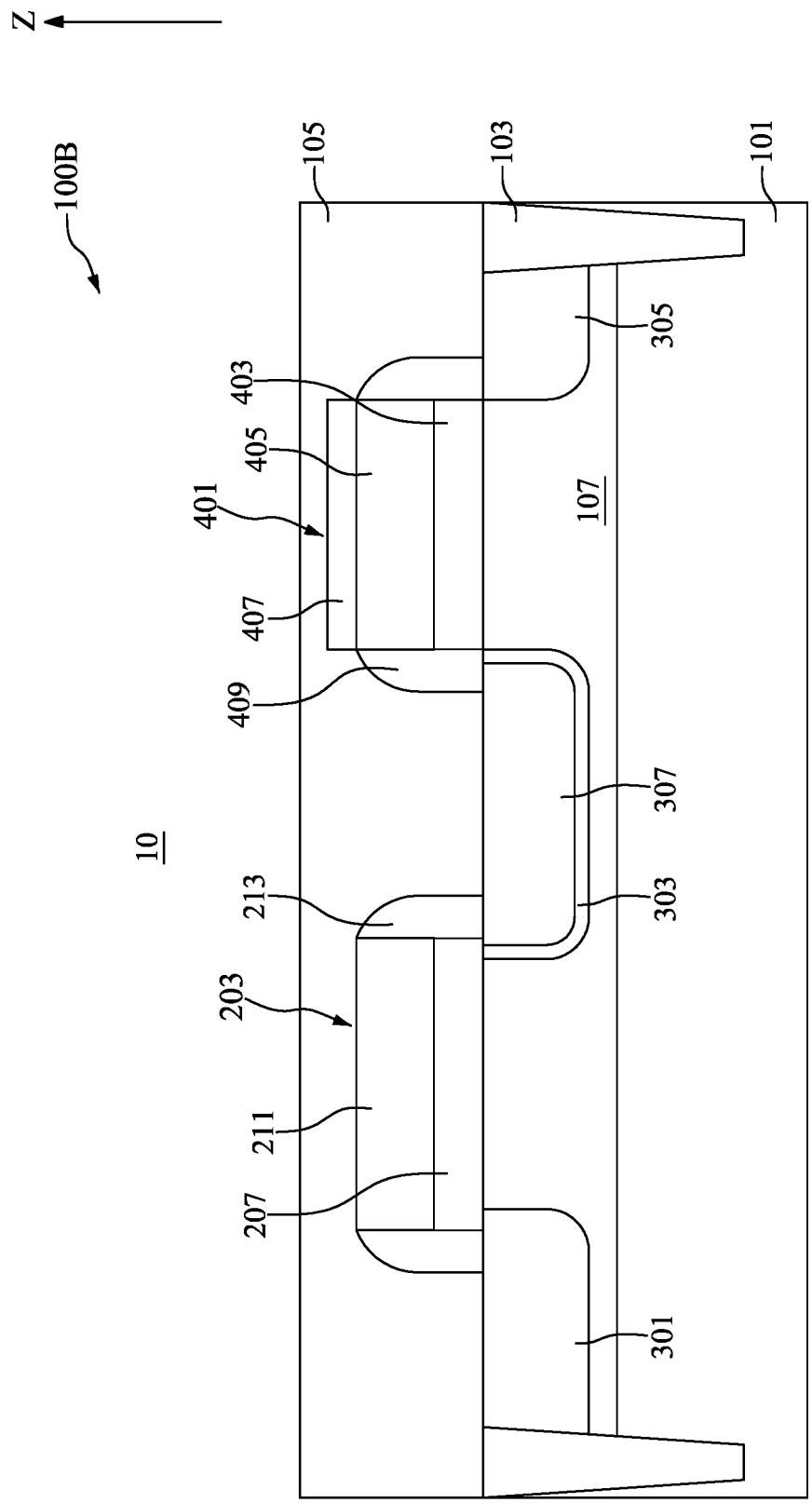
FIG. 4 is a schematic cross-sectional view diagram taken along the line A-A' in FIG. 1 for a semiconductor device in accordance with another embodiment of the present disclosure.
Figure 5:
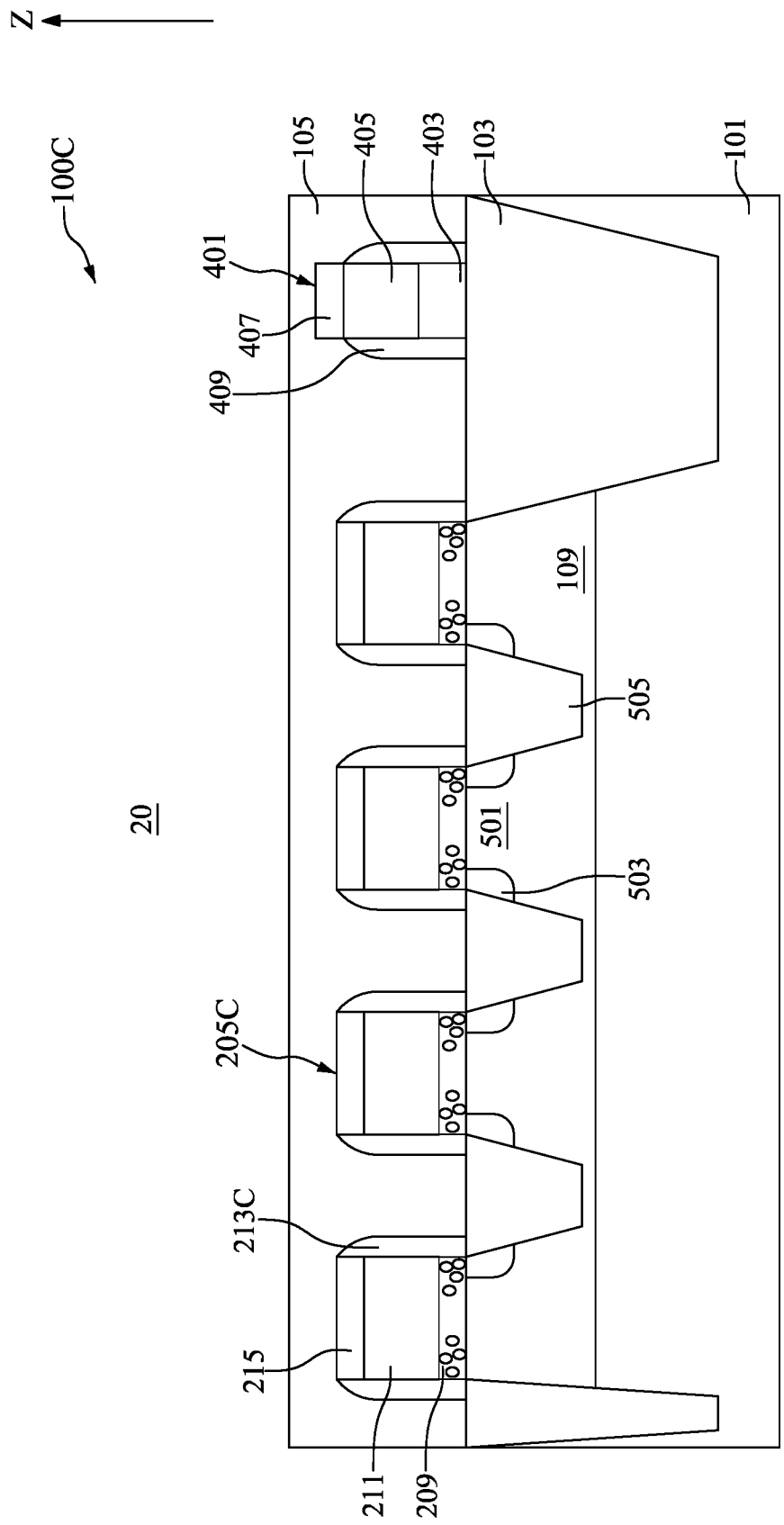
FIGS. 5 to 7 are schematic cross-sectional view diagrams taken along the line B-B' in FIG. 1 for semiconductor devices in accordance with other embodiments of the present disclosure.
Figure 6:
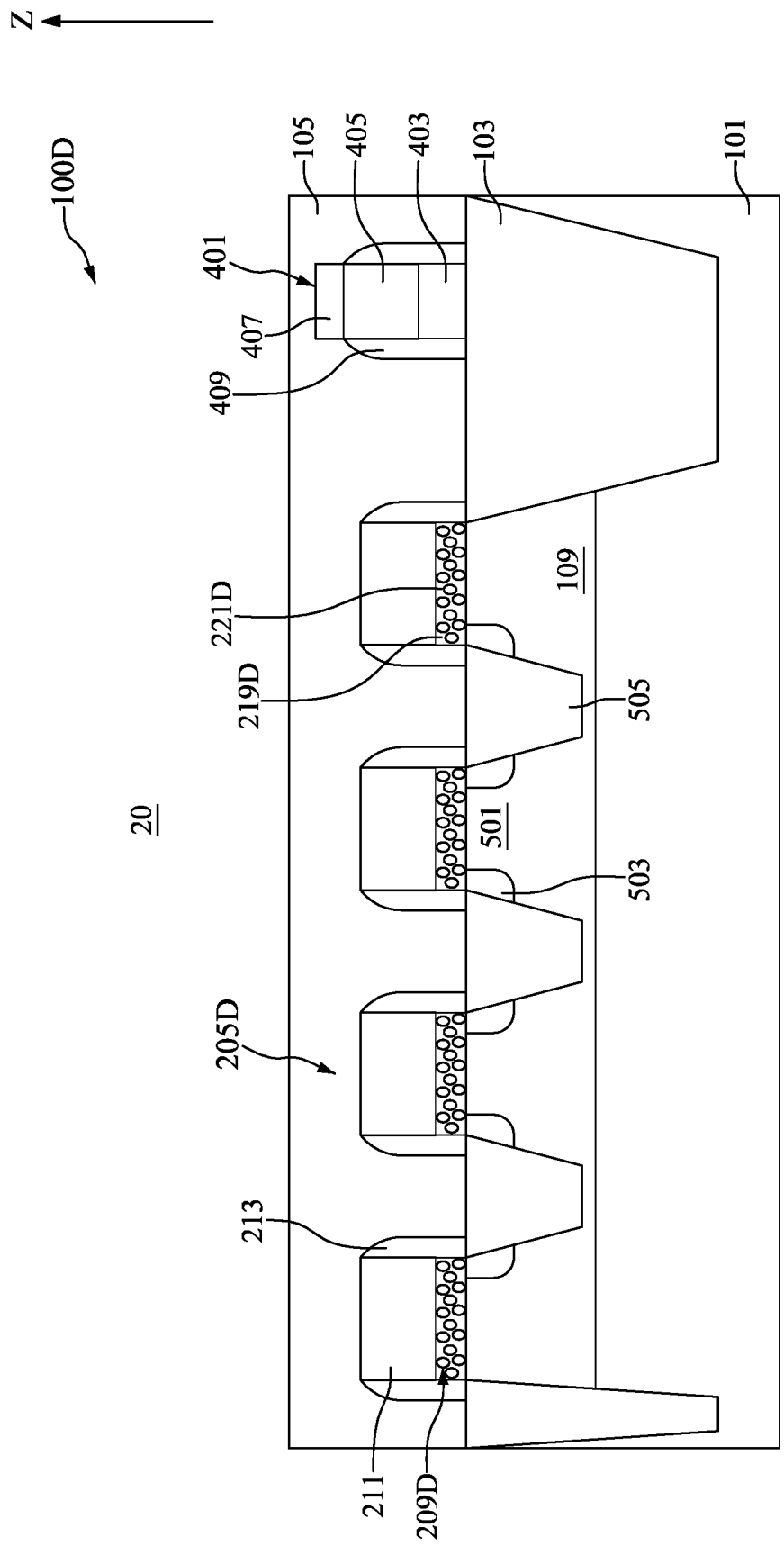
Figure 7:
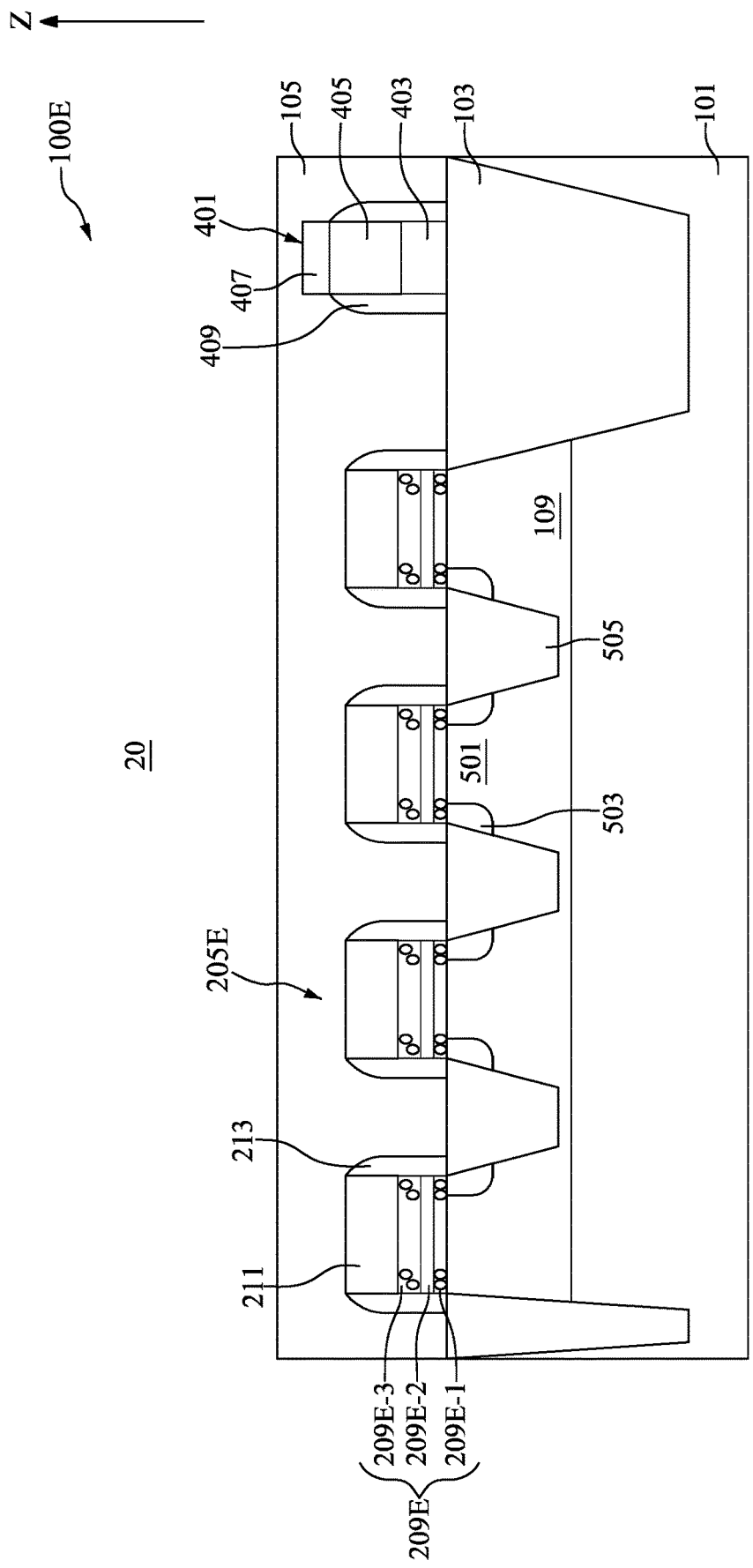

FIG. 4 is a schematic cross-sectional view diagram taken along the line A-A' in FIG. 1 for a semiconductor device 100B in accordance with another embodiment of the present disclosure. FIGS. 5 to 7 are schematic cross-sectional view diagrams taken along the line B-B' in FIG. 1 for semiconductor devices 100C, 100D, and 100E in accordance with other embodiments of the present disclosure.

With reference to FIG. 4, the semiconductor device 100B may include a fourth doped region 307. The fourth doped region 307 may be disposed in the second doped region 303. The fourth doped region 307 may be doped with a dopant such as boron. The fourth doped region 307 may have a dopant concentration greater than that of the second doped region 303.

With reference to FIG. 5, the semiconductor device 100C may include a memory unit capping layer 215. The memory unit capping layer 215 may be disposed on the memory unit conductive layer 211. The memory unit capping layer 215 may be formed of, for example, silicon oxide, silicon nitride, silicon oxynitride, or silicon nitride oxide. The plurality of memory unit spacers 213C may be attached to sidewalls of the memory unit capping layer 215.

With reference to FIG. 6, in the semiconductor device 100D, oxygen at the sidewall portions 219D of the lateral oxidized intervention layer 209D may diffuse to the center of the lateral oxidized intervention layer 209D. The lateral oxidized intervention layer 209D may be fully oxidized. The concentration of oxygen at the sidewall portions 219D of the lateral oxidized intervention layer 209D and the concentration of oxygen at the center portion 221D of the lateral oxidized intervention layer 209D may be about the same. The lateral oxidized intervention layer 209D in FIG. 6 may have a dielectric constant greater than a dielectric constant of the lateral oxidized intervention layer 209 in FIG. 3.

With reference to FIG. 7, in the semiconductor device 100E, the lateral oxidized intervention layer 209E may include a bottom intervention insulating layer 209E-1, a middle intervention insulating layer 209E-2, and a top intervention insulating layer 209E-3. The bottom intervention insulating layer 209E-1 may be disposed on the control unit 501. The middle intervention insulating layer 209E-2 may be disposed on the bottom intervention insulating layer 209E-1, and the top intervention insulating layer 209E-3 may be disposed on the middle intervention insulating layer 209E-2. The bottom intervention insulating layer 209E-1 and the top intervention insulating layer 209E-3 may be formed of, for example, an oxide layer. The middle intervention insulating layer 209E-2 may be formed of, for example, silicon nitride. A concentration of oxygen at sidewall portions of the bottom intervention insulating layer 209E-1 and the top intervention insulating layer 209E-3 may be greater than a concentration of oxygen at center portions of the bottom intervention insulating layer 209E-1 and the top intervention insulating layer 209E-3. The oxide layer may be formed of, for example, silicon oxide, aluminum oxide, hafnium oxide, zirconium oxide, or a combination thereof.

Figure 8:
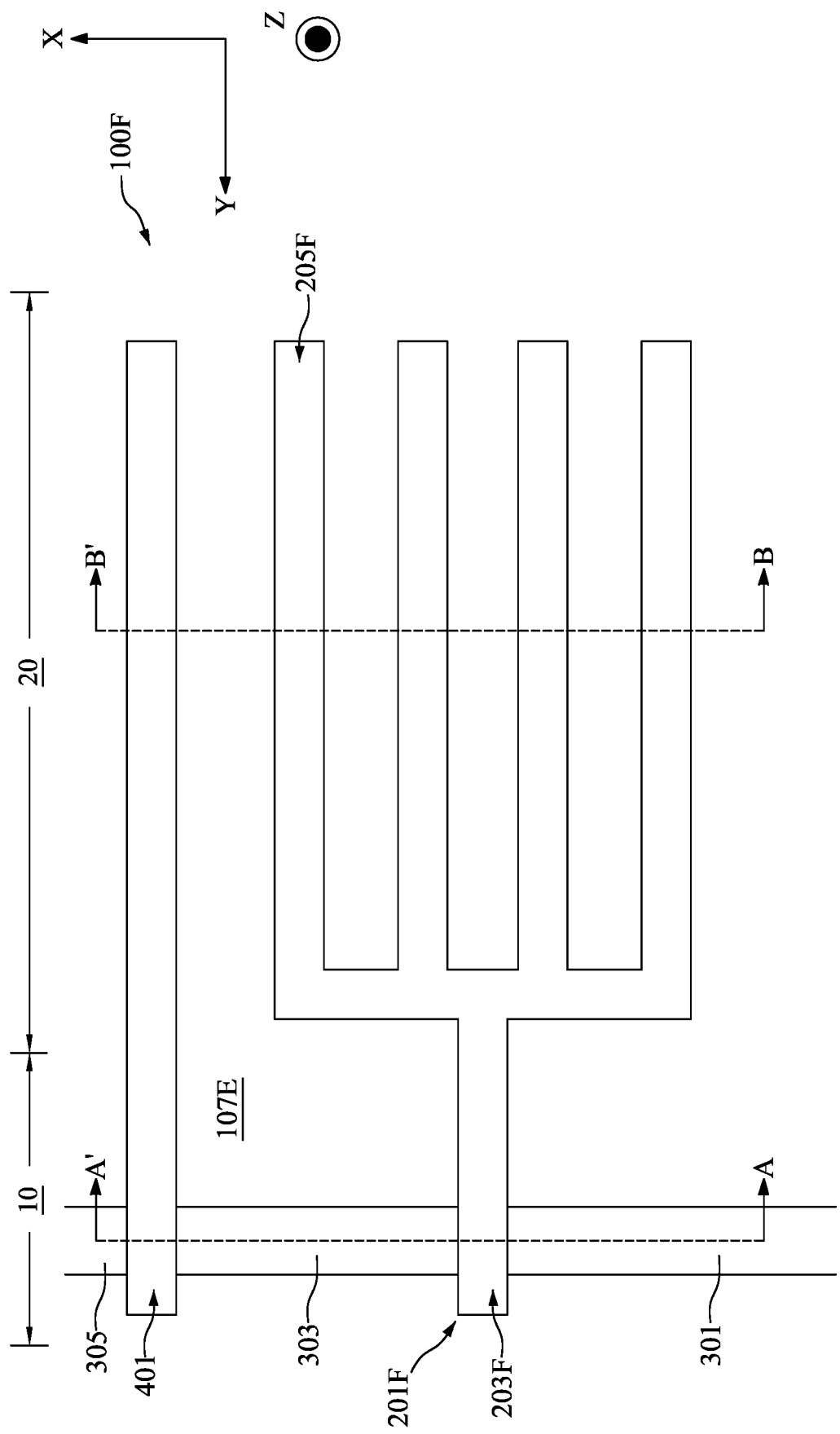
FIG. 8 illustrates, in a schematic top-view diagram, a semiconductor device in accordance with one embodiment of the present disclosure.
Figure 9:
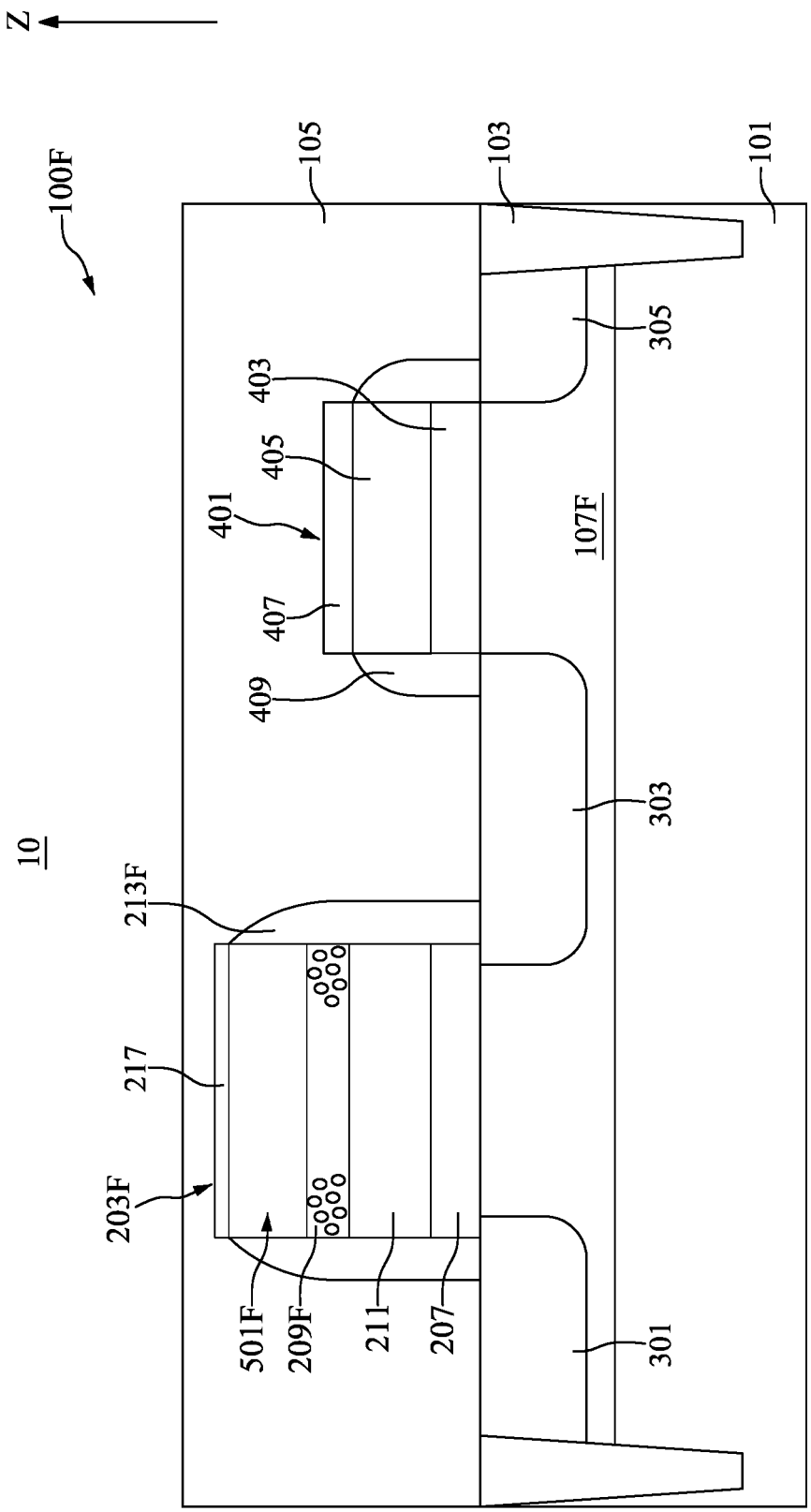
FIG. 9 is a schematic cross-sectional view diagram taken along a line A-A' in FIG. 8.
Figure 10:
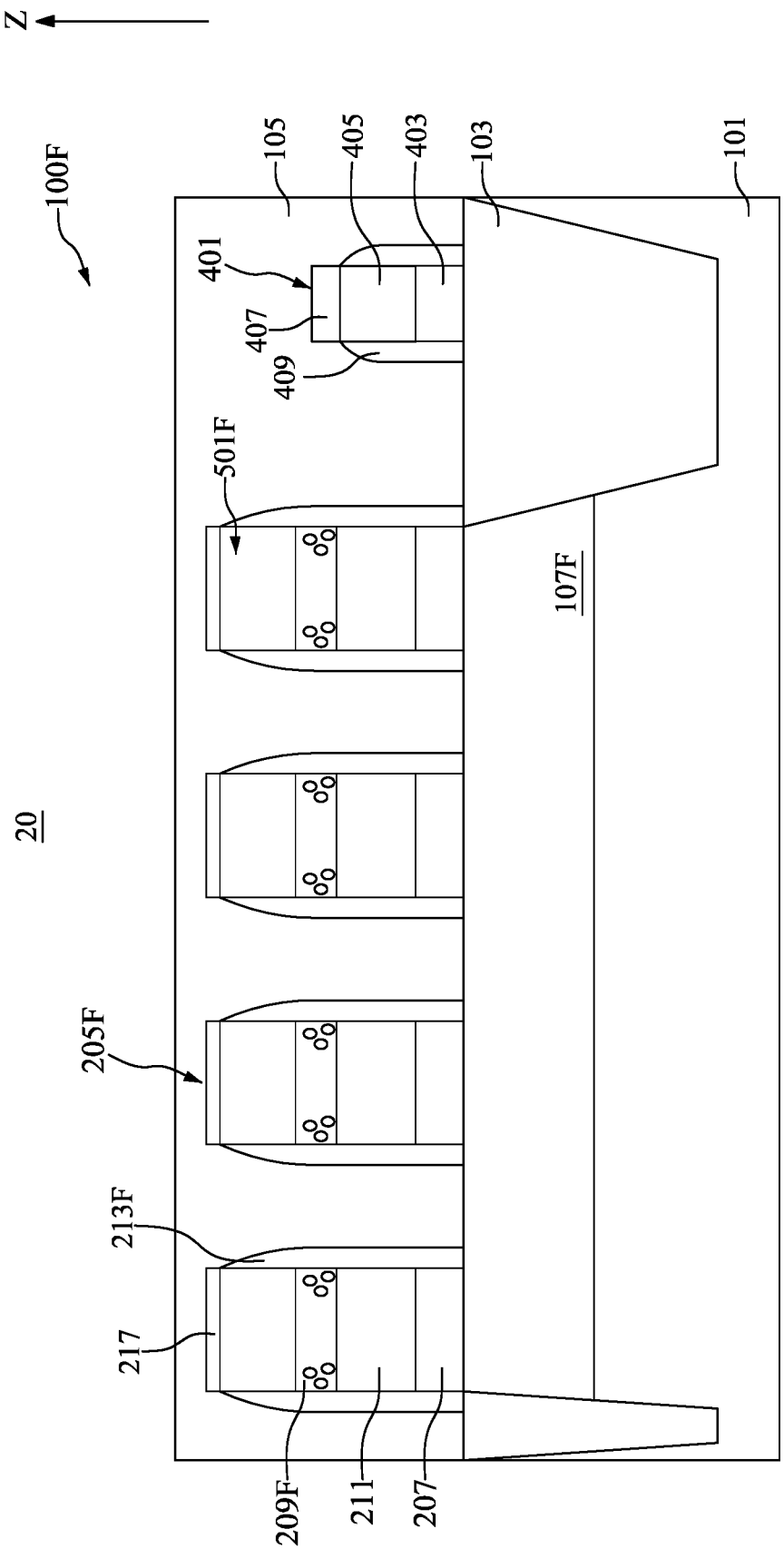
FIG. 10 is a schematic cross-sectional view diagram taken along a line B-B' in FIG. 8.

FIG. 8 illustrates, in a schematic top-view diagram, a semiconductor device 100F in accordance with one embodiment of the present disclosure. FIG. 9 is a schematic cross-sectional view diagram taken along a line A-A' in FIG. 8. FIG. 10 is a schematic cross-sectional view diagram taken along a line B-B' in FIG. 8.

With reference to FIGS. 8 to 10, the first well region 107F may be disposed in the first area 10 and the second area 20 of the substrate 101. The lateral oxidized intervention layer 209F may be disposed above the first area 10 and the second area 20 of the substrate 101. The lateral oxidized intervention layer 209F may be disposed on the memory unit conductive layer 211. The control unit 501F may be disposed above the first area 10 and second area 20 of the substrate 101. The control unit 501F may be disposed on the lateral oxidized intervention layer 209F. The control unit 501F may be formed of, for example, polysilicon or polysilicon-germanium. A memory top conductive layer 217 may be disposed above the first area 10 and the second area 20 of the substrate 101. The memory top conductive layer 217 may be disposed on the control unit 501F. The memory top conductive layer 217 may be formed of, for example, metal silicide.

With reference to FIGS. 8 to 10, the plurality of memory unit spacers 213F may be attached to sidewalls of the control unit 501F, sidewall portions of the lateral oxidized intervention layer 209F, sidewalls of the memory unit conductive layer 211, and sidewalls of a tunneling insulating layer 207. The tunneling insulating layer 207, the memory unit conductive layer 211, the lateral oxidized intervention layer 209F, the control unit 501F, the plurality of memory unit spacers 213F, and the memory top conductive layer 217 together form the handle portion 203F and the fork portion 205F of the memory unit 201F.

Figure 11:
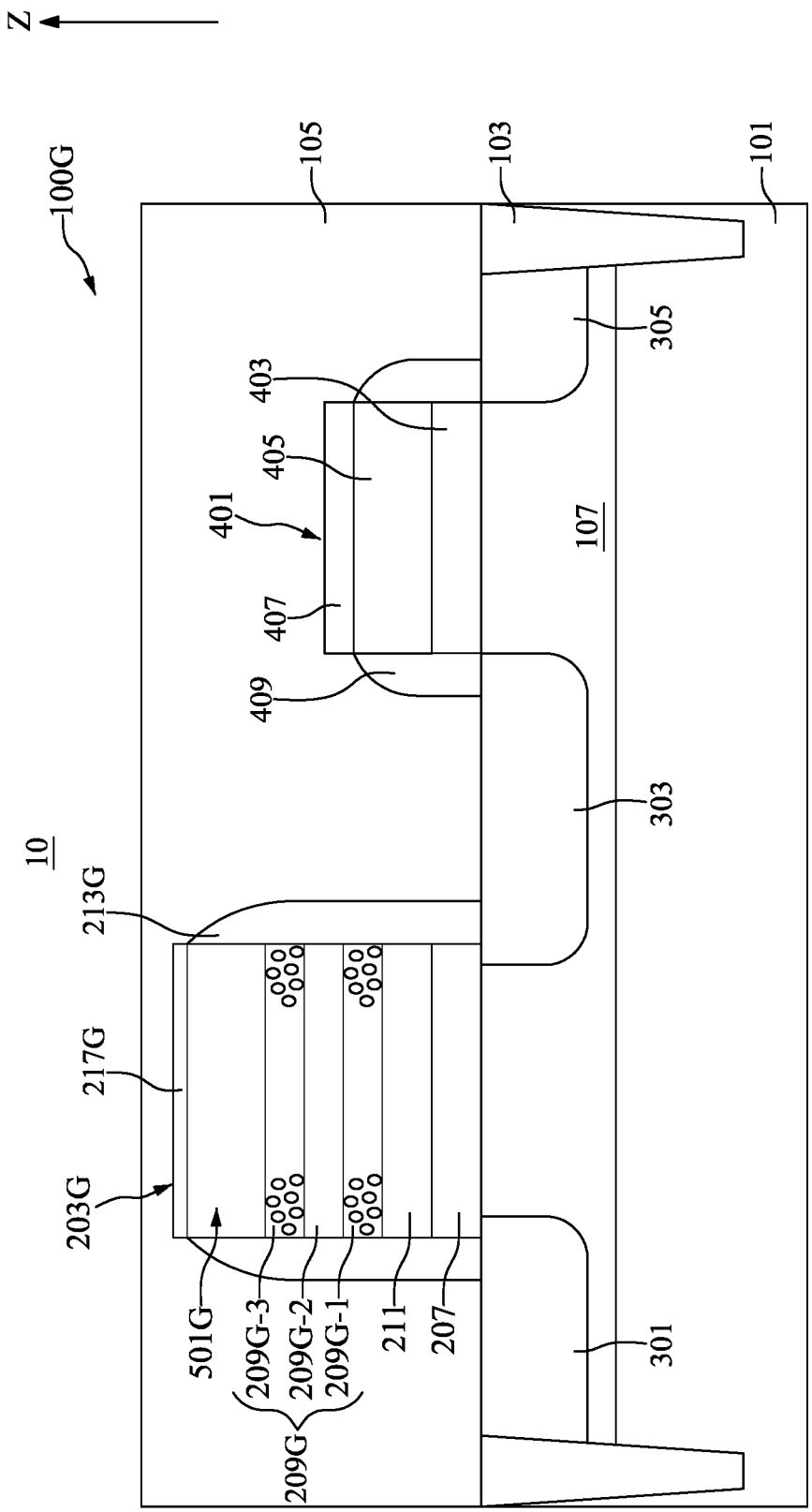
FIGS. 11 and 12 are schematic cross-sectional view diagrams taken along the line A-A' in FIG. 8 for semiconductor devices in accordance with other embodiments of the present disclosure.
Figure 12:
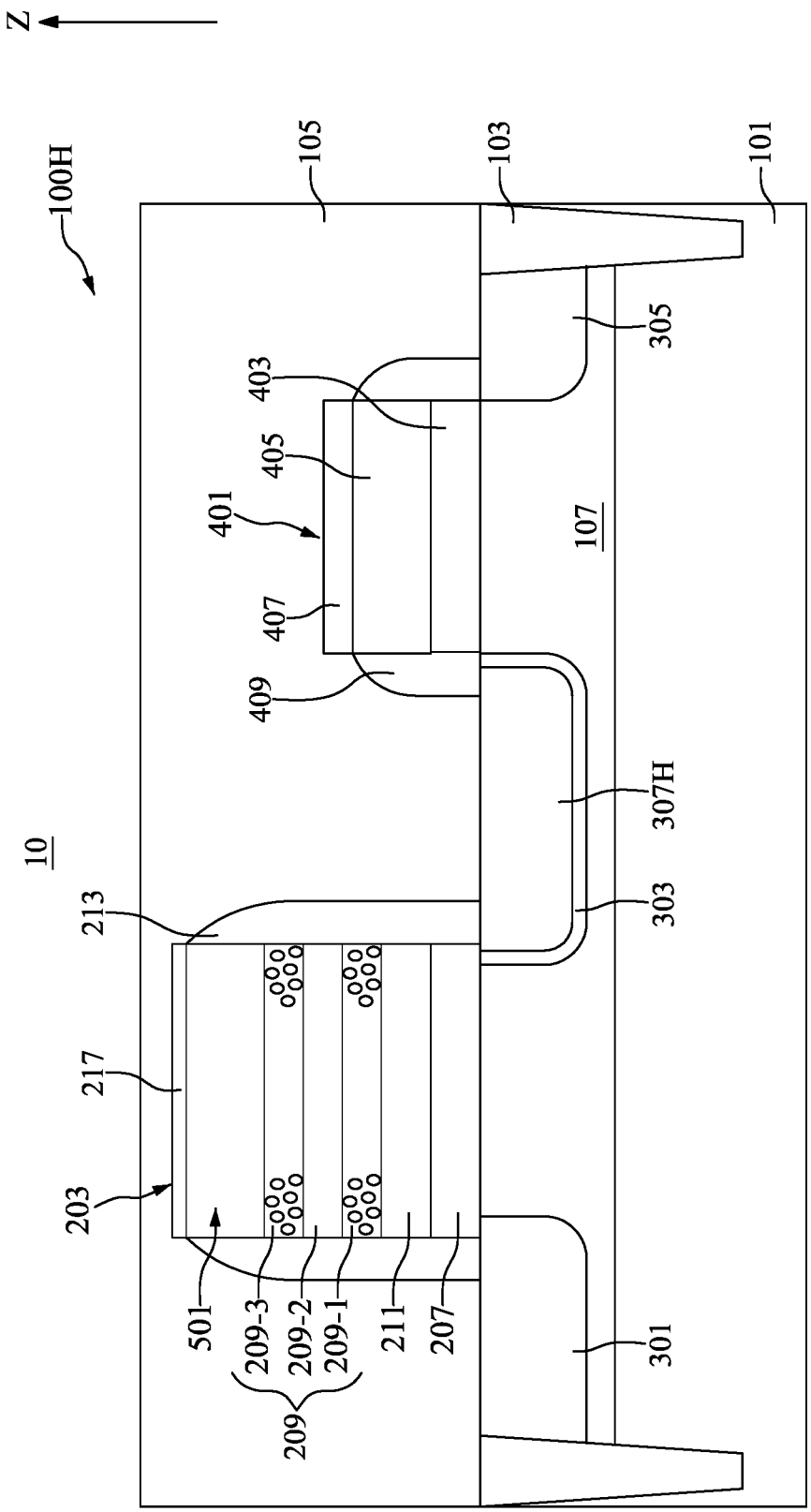

FIGS. 11 and 12 are schematic cross-sectional view diagrams taken along the line A-A' in FIG. 8 for semiconductor devices 100G and 100H in accordance with other embodiments of the present disclosure.

With reference to FIG. 11, in the semiconductor device 100G, the lateral oxidized intervention layer 209G may include a bottom intervention insulating layer 209G-1, a middle intervention insulating layer 209G-2, and a top intervention insulating layer 209G-3. The bottom intervention insulating layer 209G-1 may be disposed on the memory unit conductive layer 211. The middle intervention insulating layer 209G-2 may be disposed on the bottom intervention insulating layer 209G-1. The top intervention insulating layer 209G-3 may be disposed on the middle intervention insulating layer 209G-2. The control unit 501G may be disposed on the top intervention insulating layer 209G-3.

With reference to FIG. 12, the semiconductor device 100H may include a fourth doped region 307H. The fourth doped region 307H may be disposed in the second doped region 303. The fourth doped region 307H may be doped with a dopant such as boron. A dopant concentration of the fourth doped region 307H may be greater than a dopant concentration of the second doped region 303.

Figure 13:
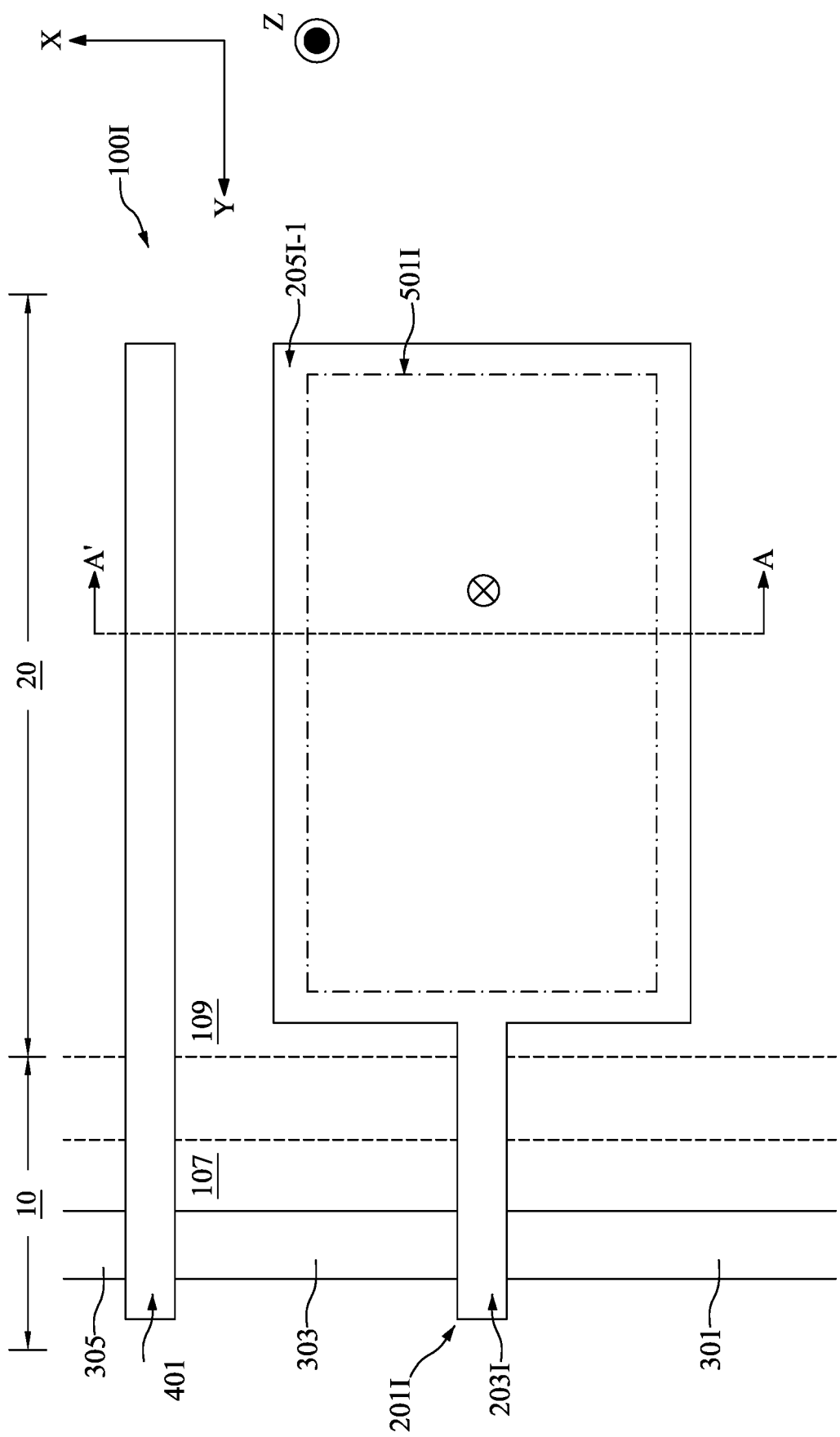
FIG. 13 illustrates, in a schematic top-view diagram, a semiconductor device in accordance with one embodiment of the present disclosure.
Figure 14:
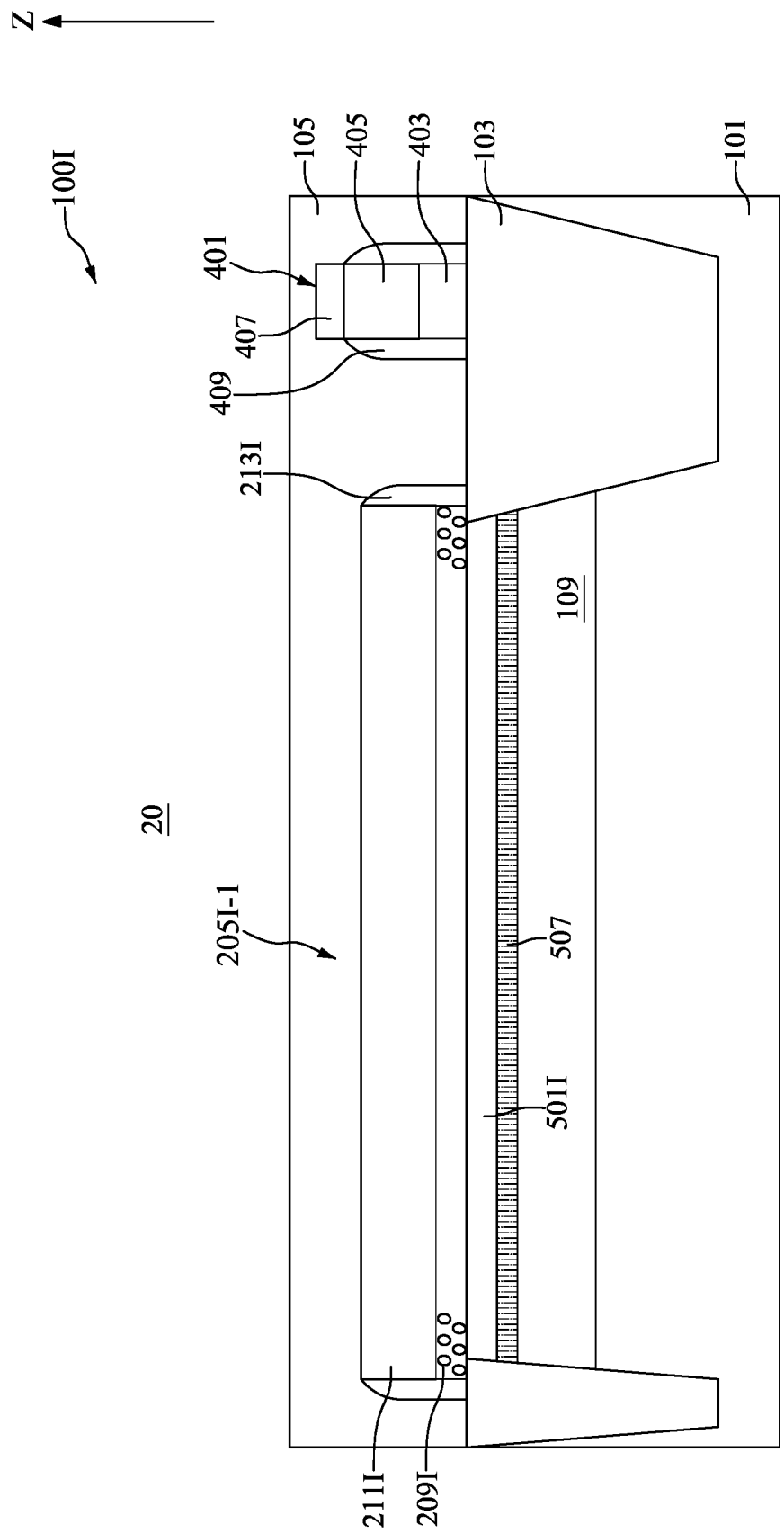
FIG. 14 is a schematic cross-sectional view diagram taken along a line A-A' in FIG. 13.

FIG. 13 illustrates, in a schematic top-view diagram, a semiconductor device 100I in accordance with one embodiment of the present disclosure. FIG. 14 is a schematic cross-sectional view diagram taken along a line A-A' in FIG. 13.

With reference to FIGS. 13 and 14, in the semiconductor device 100I, the memory unit 201I may include a handle portion 203I and a paddle portion 205I-1. The paddle portion 205I-1 may be disposed on the second area 20 of the substrate 101. From a top-view perspective, the paddle portion 205I-1 may have a rectangle shape. The control unit 501I may be disposed in the second well region 109 and may be surrounded by the isolation structure 103. An adjustment layer 507 may be disposed in the second well region 109 and below the control unit 501I. The adjustment layer 507 may be doped with a dopant such as phosphorus, arsenic, or antimony and may have the second electrical type. The adjustment layer 507 may help to adjust a threshold voltage of the control unit 501. From a top-view perspective, a ratio of a surface area of the control unit 501I to a surface area of the paddle portion 205I-1 may be greater than or equal to 90%.

Figure 15:
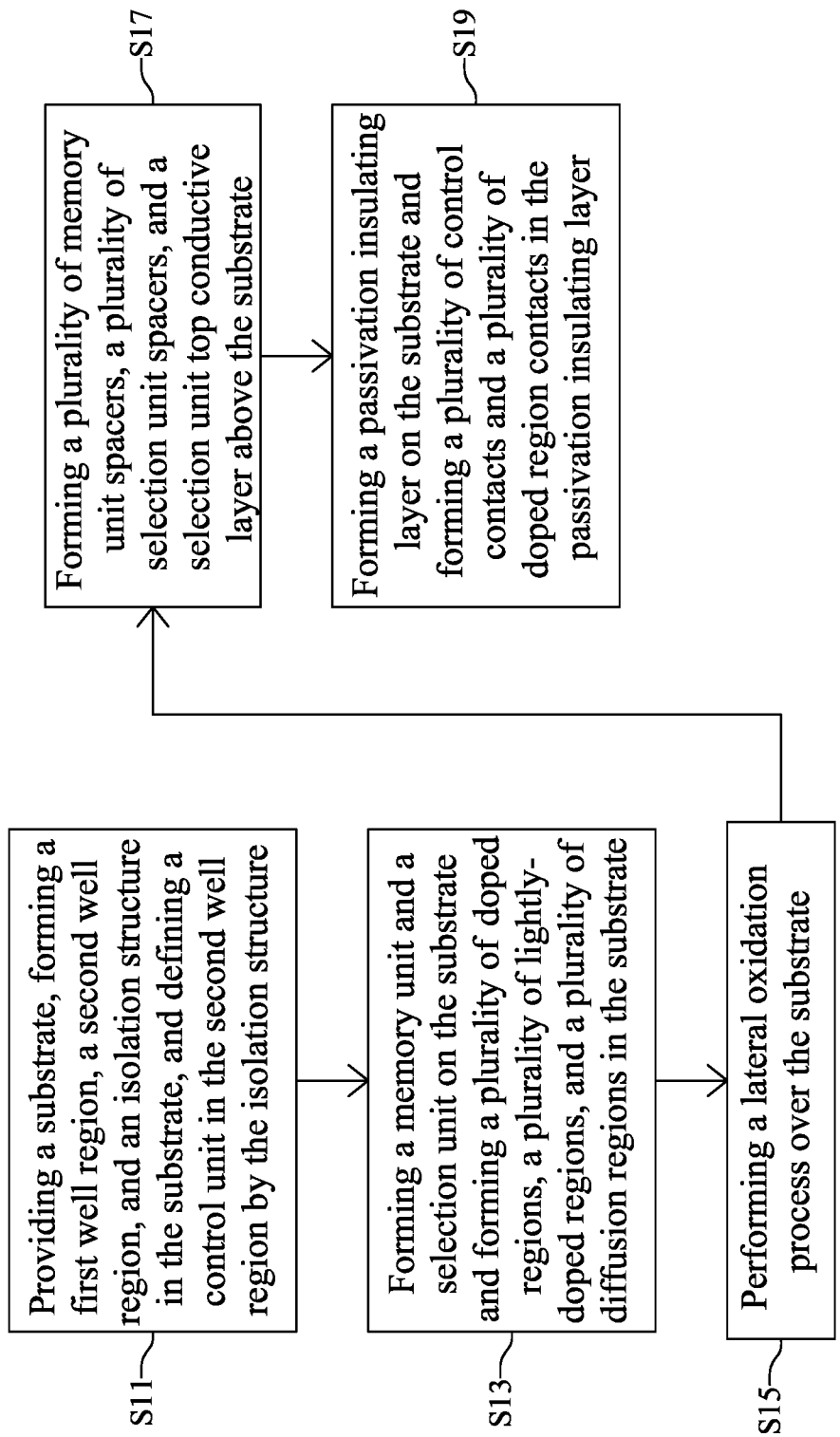
FIG. 15 illustrates, in a flowchart diagram form, a method for fabricating a semiconductor device in accordance with one embodiment of the present disclosure.
Figure 16:
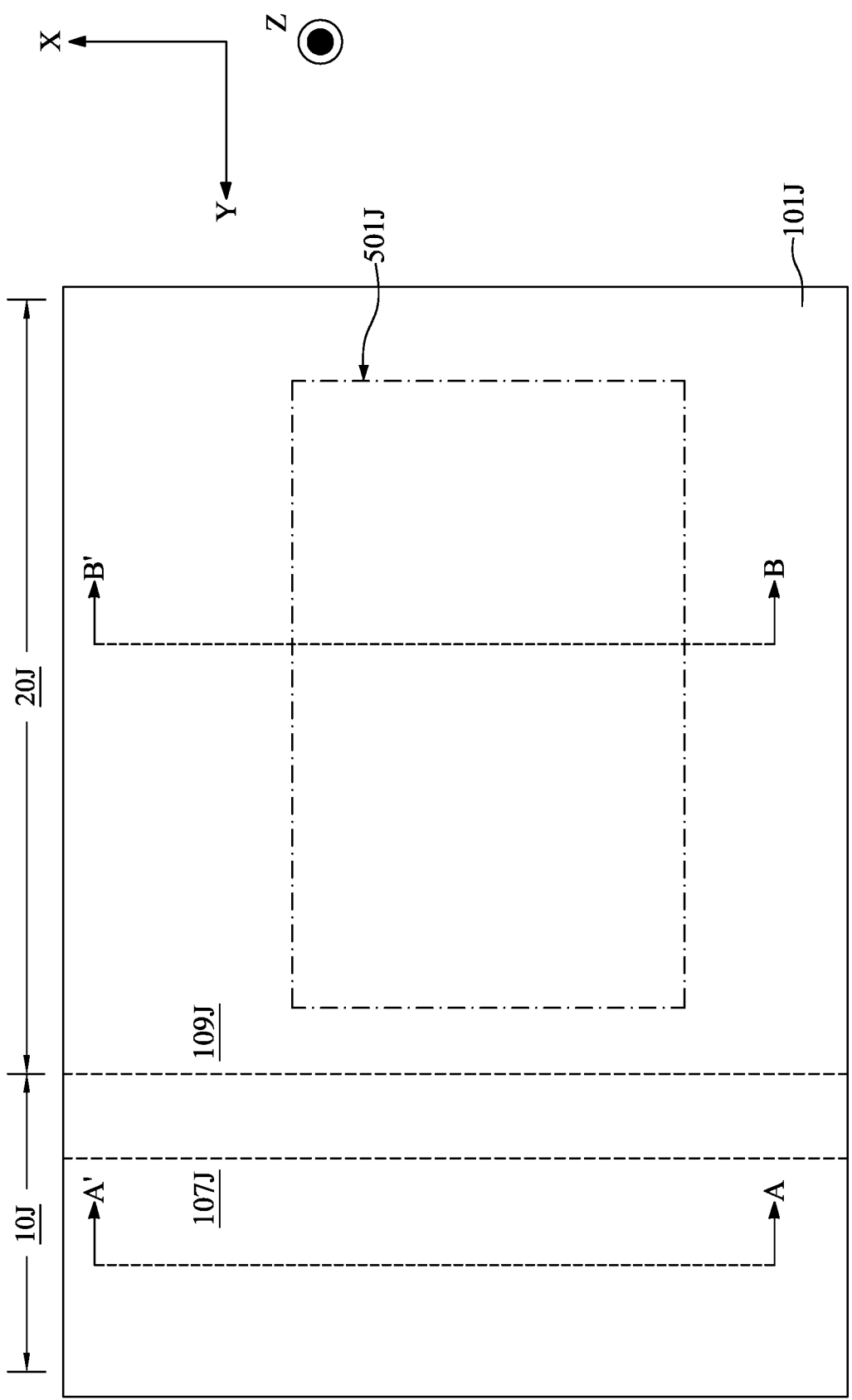
FIG. 16 illustrates, in a schematic top-view diagram, an intermediate semiconductor device in accordance with one embodiment of the present disclosure.
Figure 17:
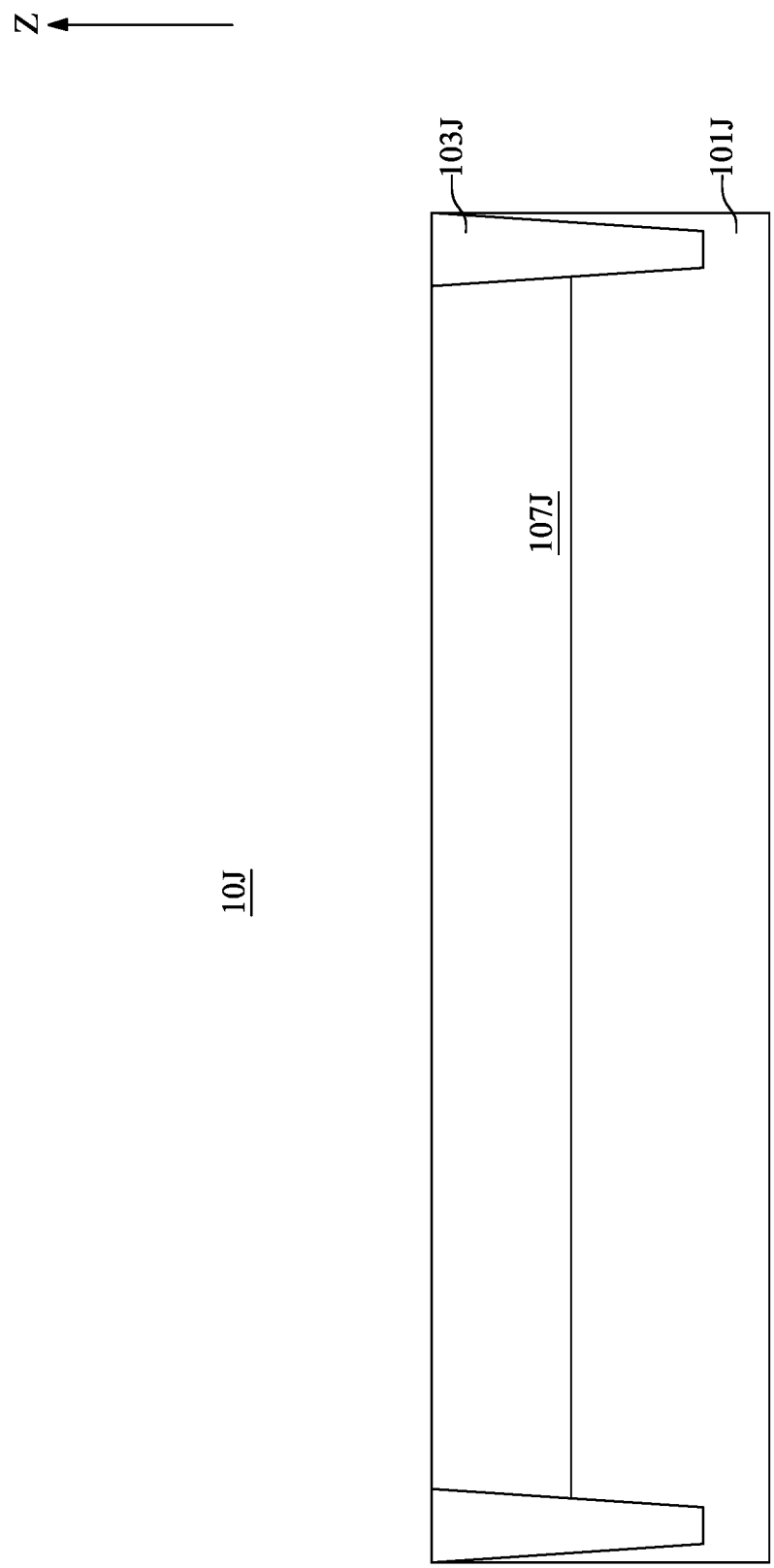
FIG. 17 is a schematic cross-sectional view diagram taken along a line A-A' in FIG. 16.
Figure 18:
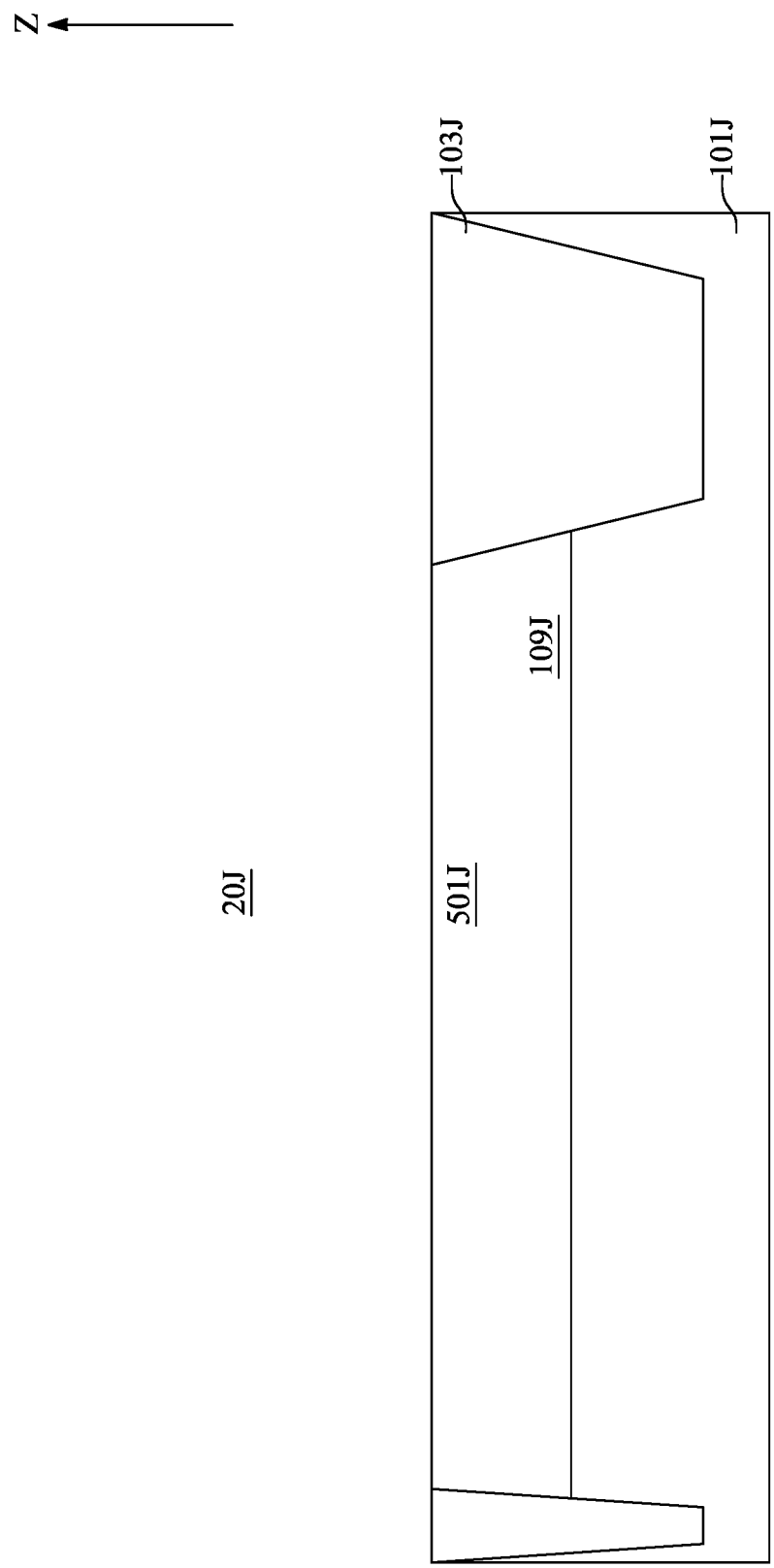
FIG. 18 is a schematic cross-sectional view diagram taken along a line B-B' in FIG. 16.

FIG. 15 illustrates, in a flowchart diagram form, a method 30 for fabricating a semiconductor device 100J in accordance with one embodiment of the present disclosure. FIG. 16 illustrates, in a schematic top-view diagram, an intermediate semiconductor device in accordance with one embodiment of the present disclosure. FIG. 17 is a schematic cross-sectional view diagram taken along a line A-A' in FIG. 16. FIG. 18 is a schematic cross-sectional view diagram taken along a line B-B' in FIG. 16.

With reference to FIGS. 15 to 18, at step S11, in the embodiment depicted, a substrate 101J may be provided, a first well region 107J, a second well region 109J, and an isolation structure 103J may be formed in the substrate 101J, and a control unit 501J may be defined in the second well region 109J by the isolation structure 103J. The substrate 101J may include a first area 10J and a second area 20J next to the first area 10J. The first well region 107J and the second well region 109J may be respectively correspondingly formed in the first area 10J and the second area 20J by a single step implantation process or a multi-step implantation process. The isolation structure 103J may be formed in the first area 10J and second area 20J and may constrain a portion of the second well region 109J to form the control unit 501J.

Figure 19:
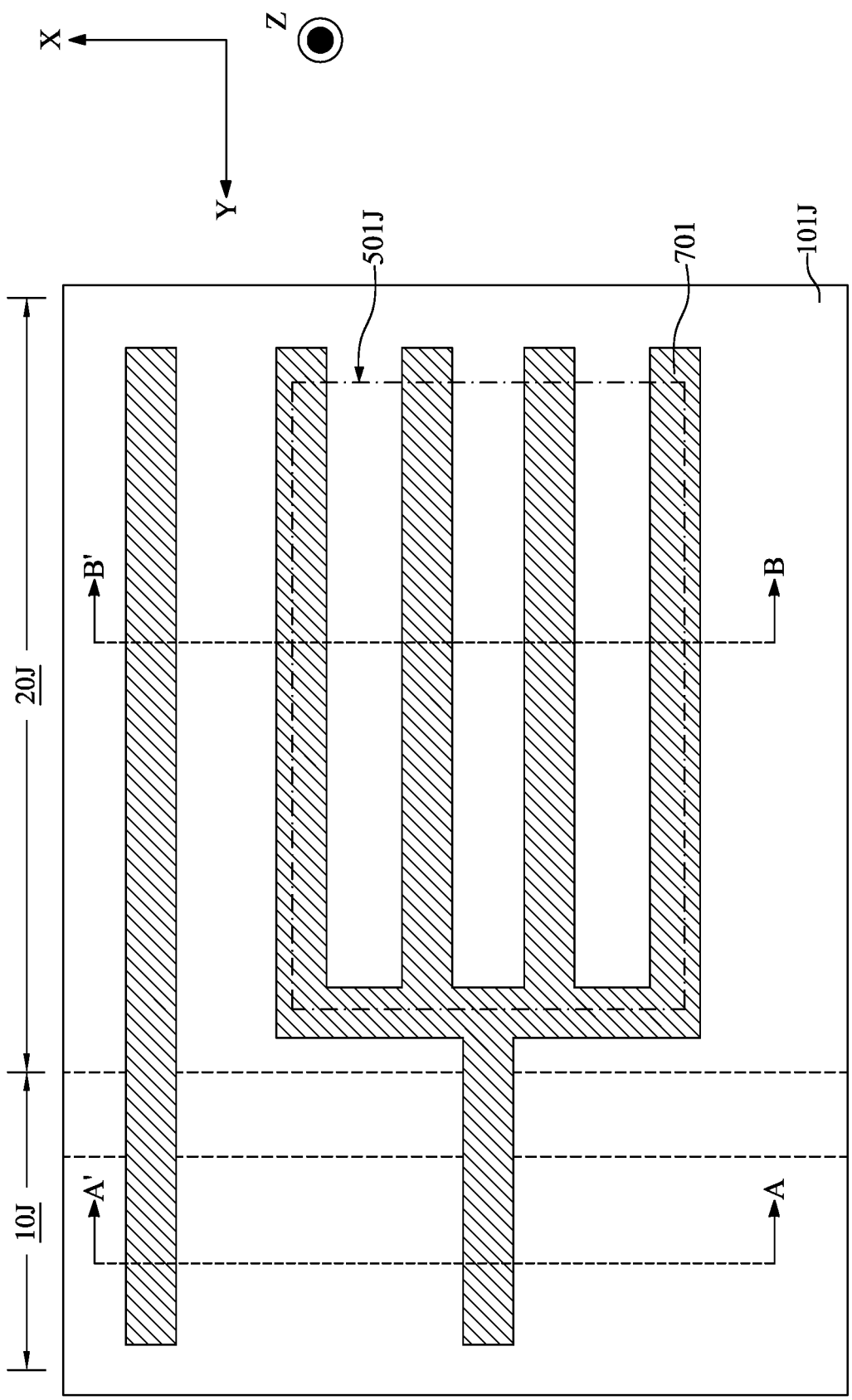
FIG. 19 illustrates, in a schematic top-view diagram, an intermediate semiconductor device in accordance with one embodiment of the present disclosure.
Figure 20:
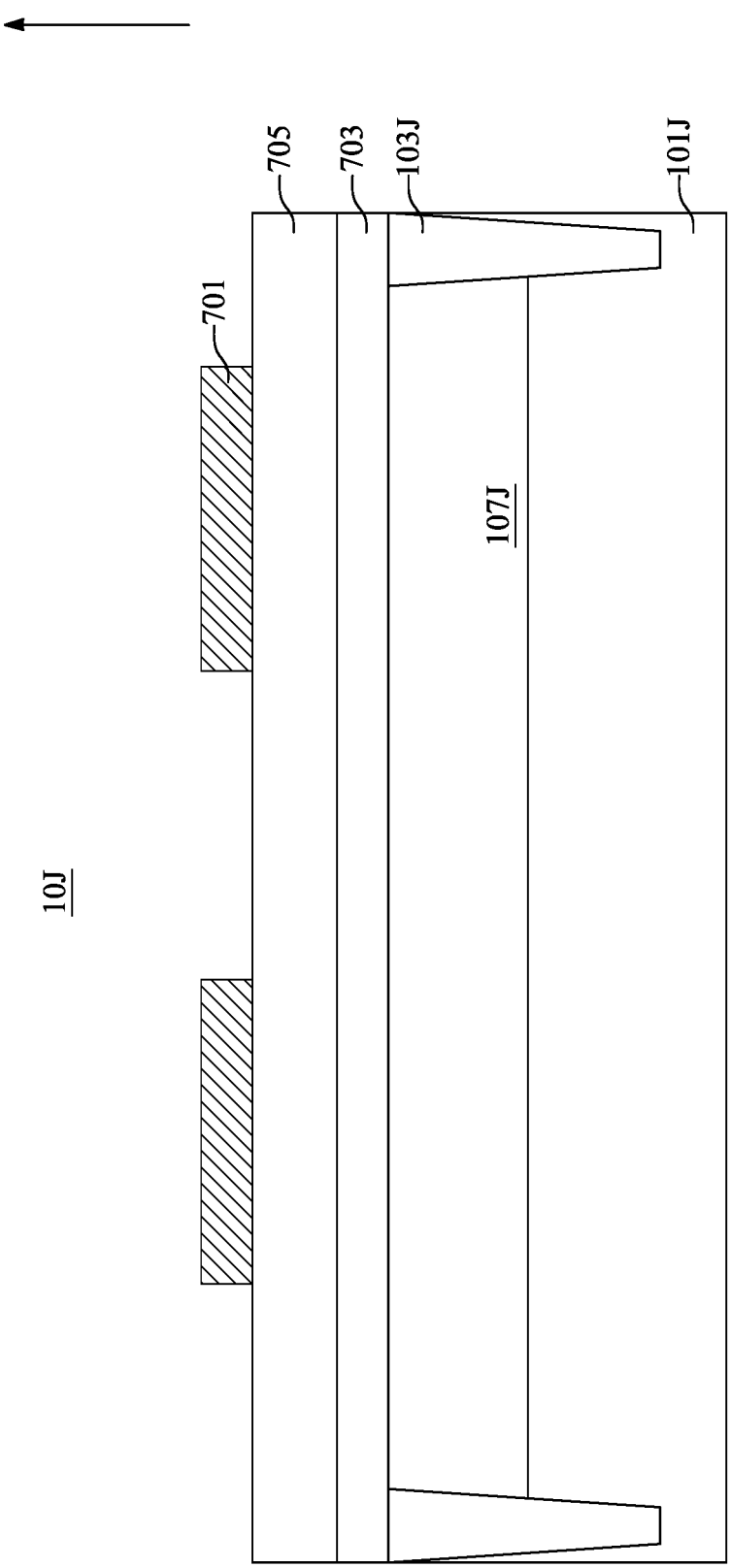
FIG. 20 is a schematic cross-sectional view diagram taken along a line A-A' in FIG. 19.
Figure 21:
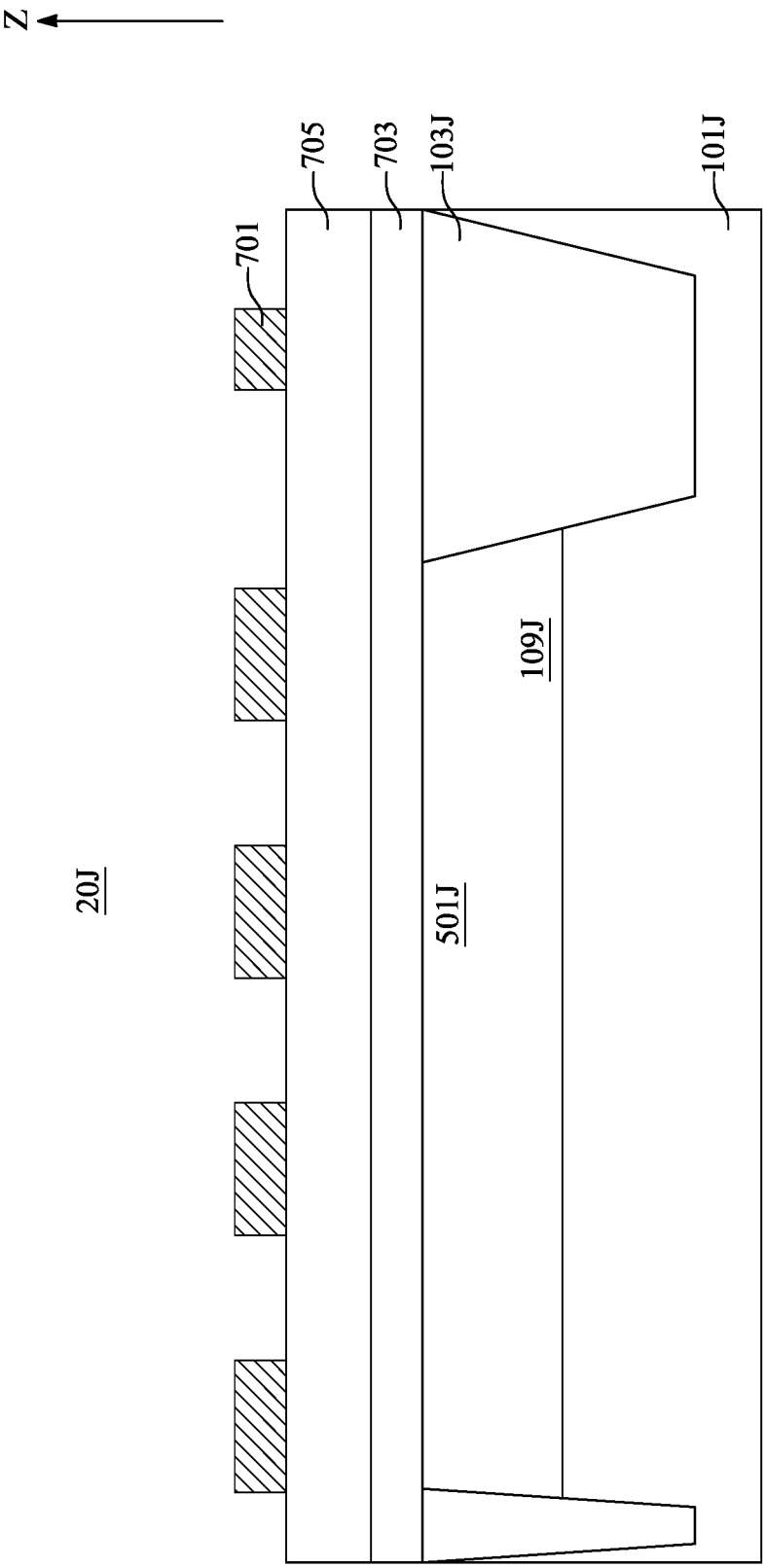
FIG. 21 is a schematic cross-sectional view diagram taken along a line B-B' in FIG. 19.
Figure 22:
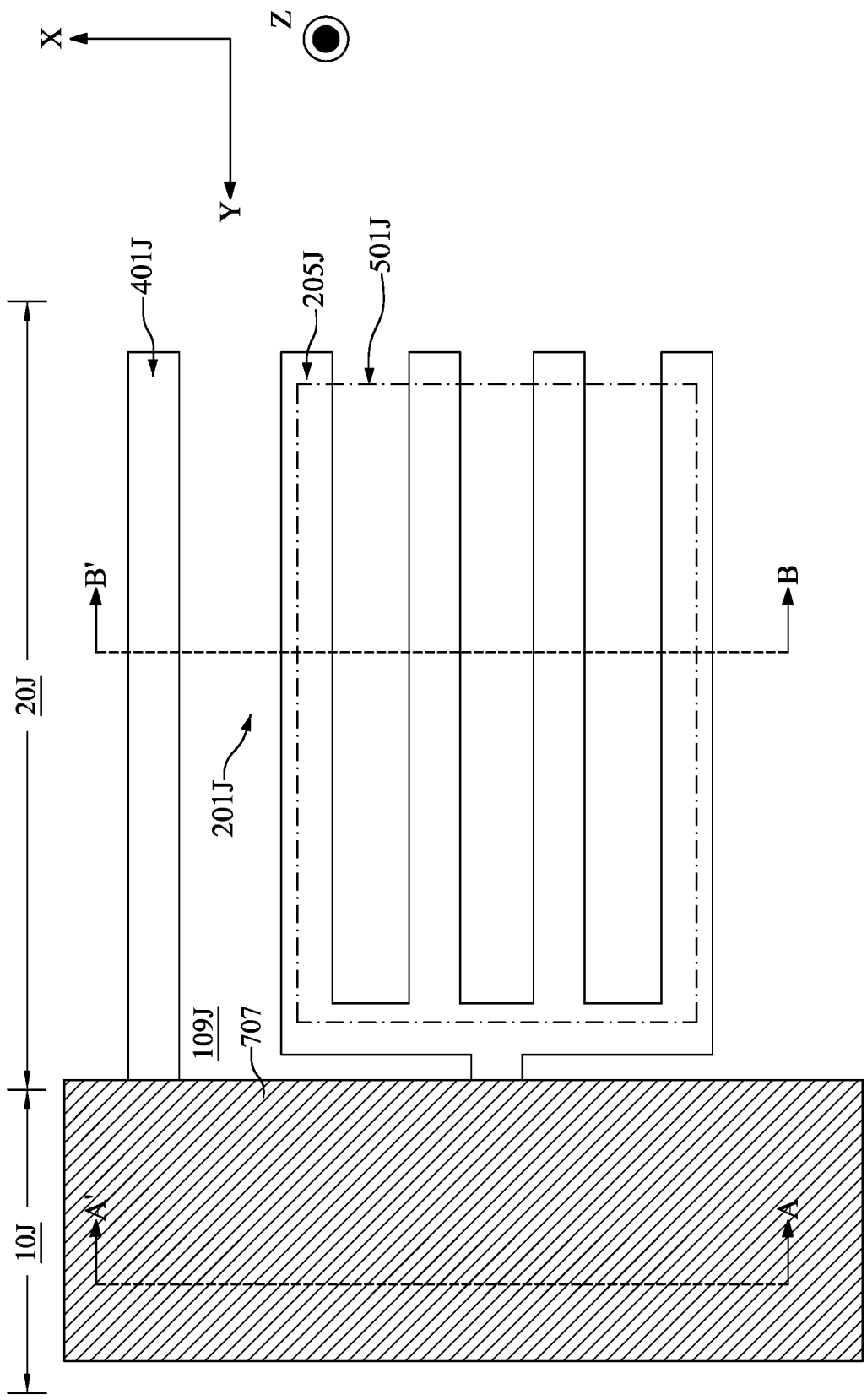
FIG. 22 illustrates, in a schematic top-view diagram, an intermediate semiconductor device in accordance with one embodiment of the present disclosure.
Figure 23:
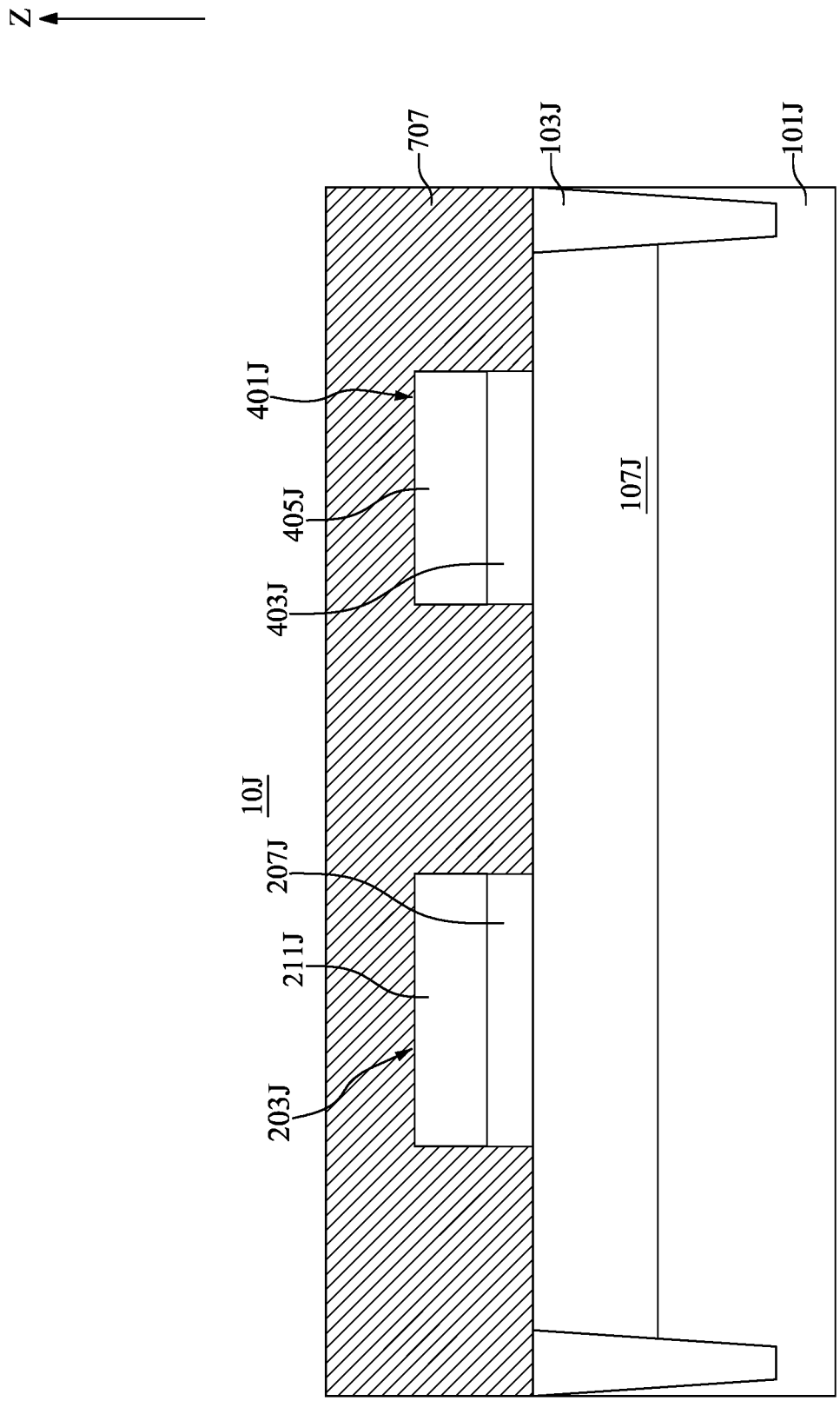
FIG. 23 is a schematic cross-sectional view diagram taken along a line A-A' in FIG. 22.
Figure 24:
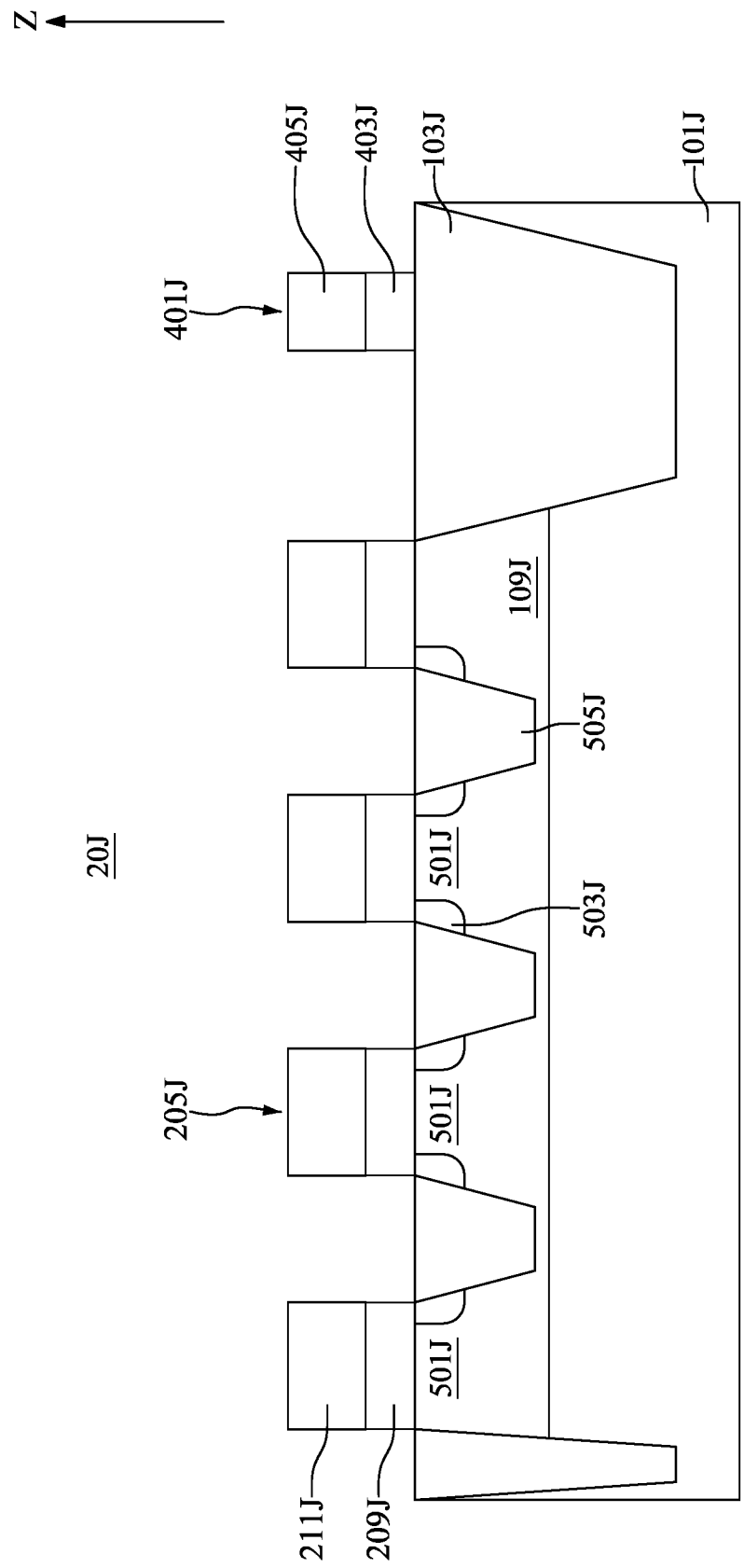
FIG. 24 is a schematic cross-sectional view diagram taken along a line B-B' in FIG. 22.
Figure 25:
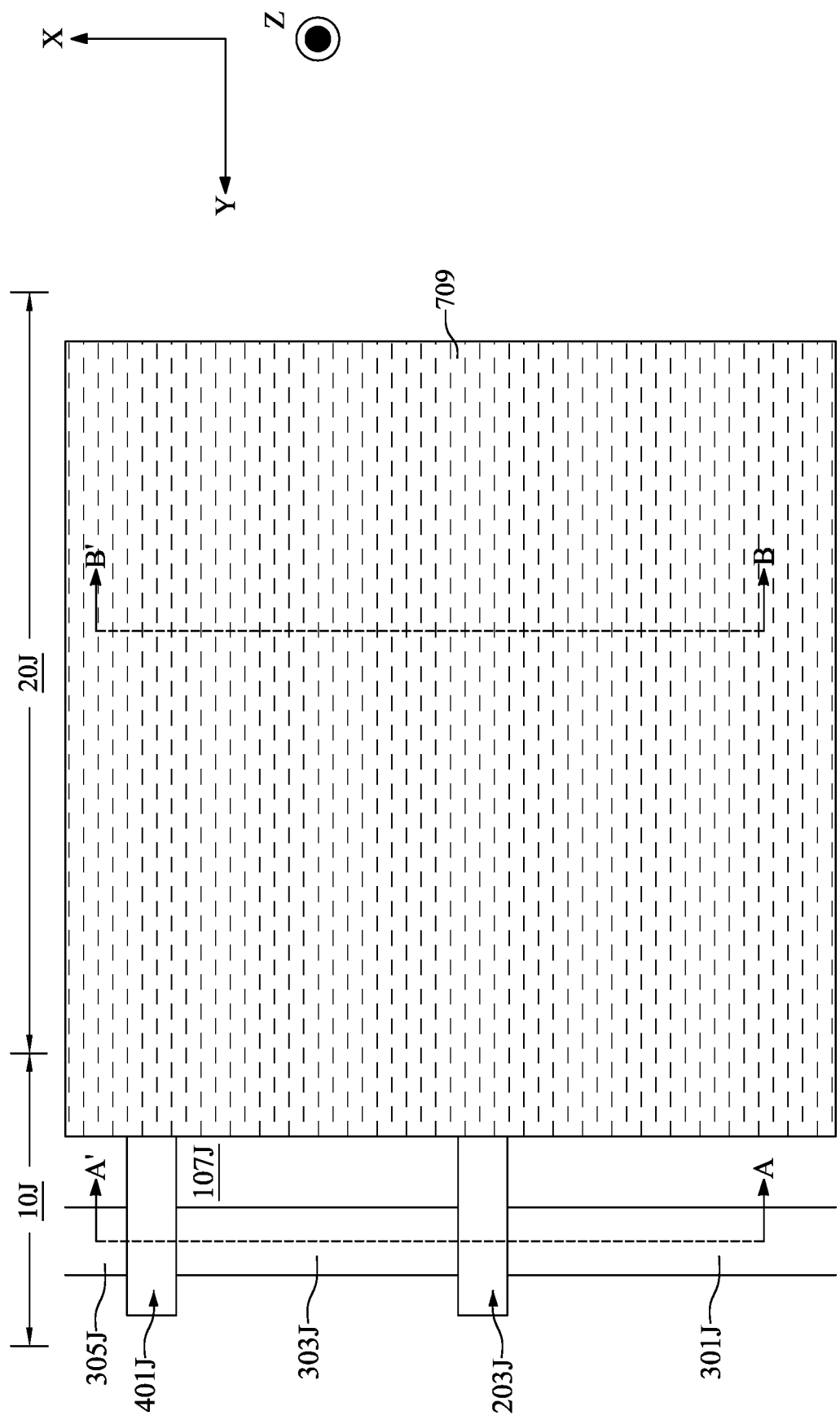
FIG. 25 illustrates, in a schematic top-view diagram, an intermediate semiconductor device in accordance with one embodiment of the present disclosure.
Figure 26:
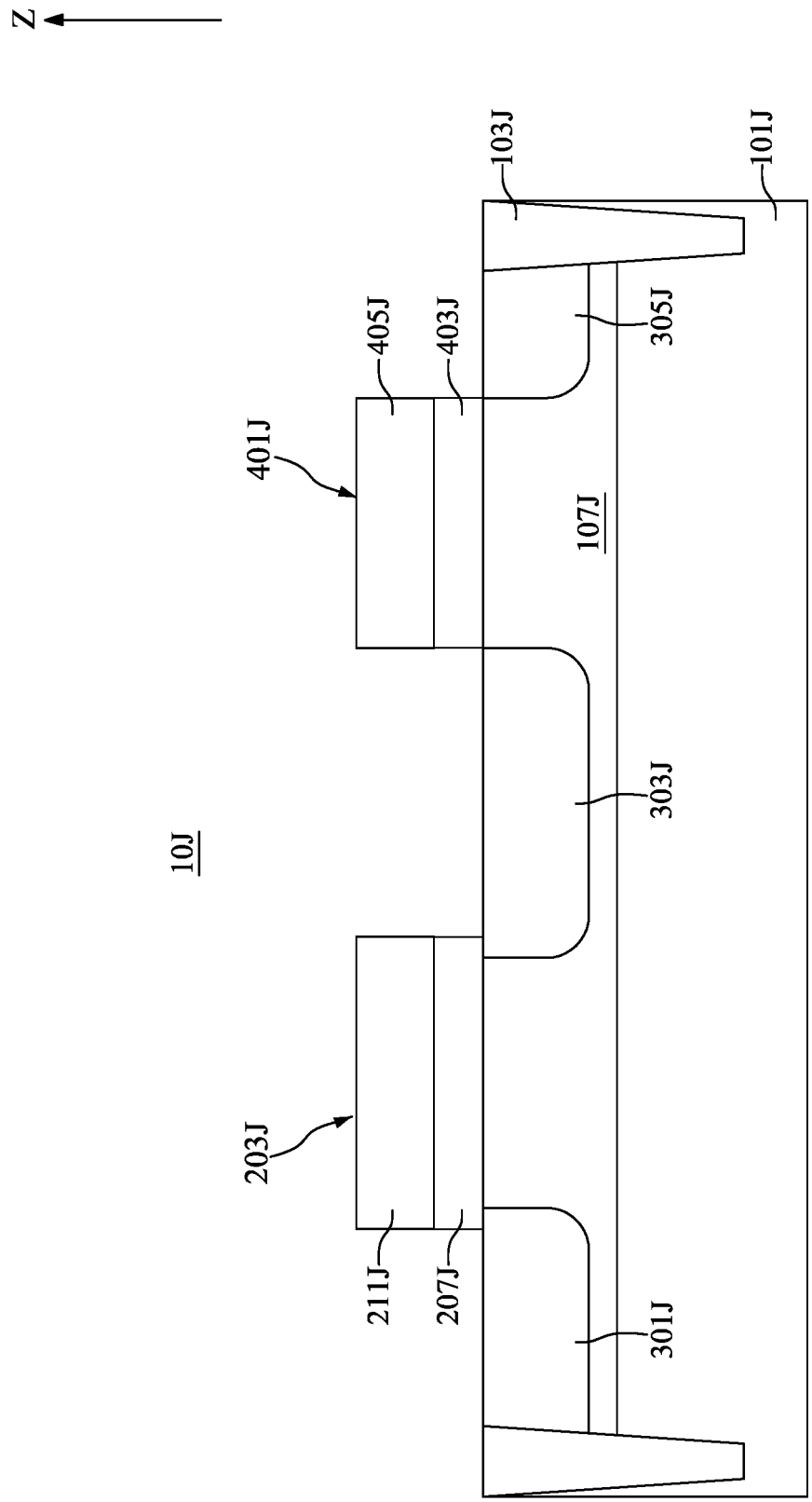
FIG. 26 is a schematic cross-sectional view diagram taken along a line A-A' in FIG. 25.
Figure 27:
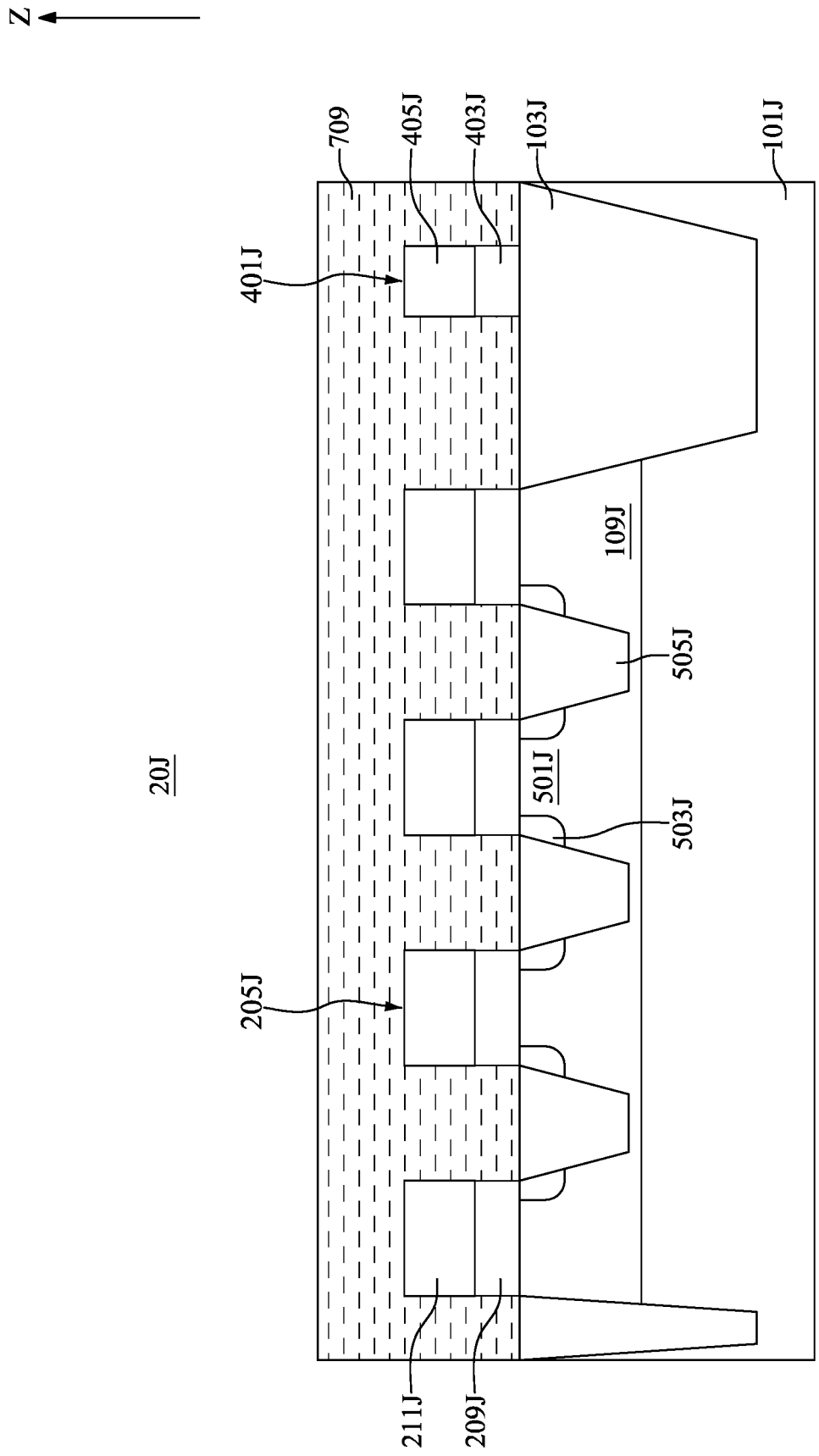
FIG. 27 is a schematic cross-sectional view diagram taken along a line B-B' in FIG. 25.

FIG. 19 illustrates, in a schematic top-view diagram, an intermediate semiconductor device in accordance with one embodiment of the present disclosure. FIG. 20 is a schematic cross-sectional view diagram taken along a line A-A' in FIG. 19. FIG. 21 is a schematic cross-sectional view diagram taken along a line B-B' in FIG. 19. FIG. 22 illustrates, in a schematic top-view diagram, an intermediate semiconductor device in accordance with one embodiment of the present disclosure. FIG. 23 is a schematic cross-sectional view diagram taken along a line A-A' in FIG. 22. FIG. 24 is a schematic cross-sectional view diagram taken along a line B-B' in FIG. 22. FIG. 25 illustrates, in a schematic top-view diagram, an intermediate semiconductor device in accordance with one embodiment of the present disclosure. FIG. 26 is a schematic cross-sectional view diagram taken along a line A-A' in FIG. 25. FIG. 27 is a schematic cross-sectional view diagram taken along a line B-B' in FIG. 25.

With reference to FIGS. 15 and 19 to 27, at step S13, in the embodiment depicted, a memory unit 201J and a selection unit 401J may be formed on the substrate 101J, and a plurality of doped regions, a plurality of lightly-doped regions 503J, and a plurality of diffusion regions 505J may be formed in the substrate 101J. With reference to FIGS. 19 to 21, a bottom insulating layer 703 and a bottom conductive layer 705 may be sequentially deposited on the substrate 101. The bottom insulating layer 703 may be formed of, for example, an insulating material having a dielectric constant of about 4.0 or greater. Alternatively, in another embodiment, the insulating material may be silicon oxide, silicon nitride, silicon oxynitride, silicon nitride oxide, or the like. The bottom conductive layer 705 may be formed of, for example, polysilicon or polysilicon-germanium. A photolithography process using a first mask layer 701 may be performed to define positions of the memory unit 201J and the selection unit 401J.

With reference to FIGS. 22 to 24, after the photolithography process, an etch process, such as an anisotropic dry etch process, may be performed to remove portions of the bottom conductive layer 705 and the bottom insulating layer 703 to form a handle portion 203J and a fork portion 205J of the memory unit 201J and the selection unit 401J. After the etch process, the bottom insulating layer 703 may be turned into a tunneling insulating layer 207J on the first area 10J, a lateral oxidized intervention layer 209J on the second area 20J, and a selection unit insulating layer 403J on the first area 10J and the second area 20J. A portion of the bottom conductive layer 705 may be turned into a memory unit conductive layer 211J, which is on the tunneling insulating layer 207J and on the lateral oxidized intervention layer 209J; another portion of the bottom conductive layer 705 may be turned into a selection unit conductive layer 405J, which is on the selection unit insulating layer 403J. The tunneling insulating layer 207J and the memory unit conductive layer 211J together form the handle portion 203J. The lateral oxidized intervention layer 209J and the memory unit conductive layer 211J together form the fork portion 205J. The selection unit insulating layer 403J and the selection unit conductive layer 405J together form the selection unit 401J.

With reference to FIGS. 22 to 24, a second mask layer 707 may be patterned to mask the first area 10J. An angled implantation process may be performed to form the plurality of lightly-doped regions 503J in the second well region 109J. Subsequently, an implantation process may be performed to form the plurality of diffusion regions 505J in the second well region 109J and between adjacent pairs of the plurality of lightly-doped regions 503J. The second mask layer 707 may be removed after the formation of the plurality of diffusion regions 505J.

With reference to FIGS. 25 to 27, a third mask layer 709 may be patterned to mask the second area 20J. An implantation process may be performed to form the plurality of doped regions in the first well region 107J. The plurality of doped regions may include a first doped region 301J, a second doped region 303J, and a third doped region 305J. The first doped region 301J and the second doped region 303J may be respectively correspondingly formed adjacent to sidewalls of the tunneling insulating layer 207J. The second doped region 303J may be formed between the tunneling insulating layer 207J and the selection unit insulating layer 403J. The third doped region 305J may be formed opposite to the second doped region 303J and adjacent to one sidewall of the selection unit insulating layer 403J. After the implantation process, the third mask layer 709 may be removed.

Figure 28:
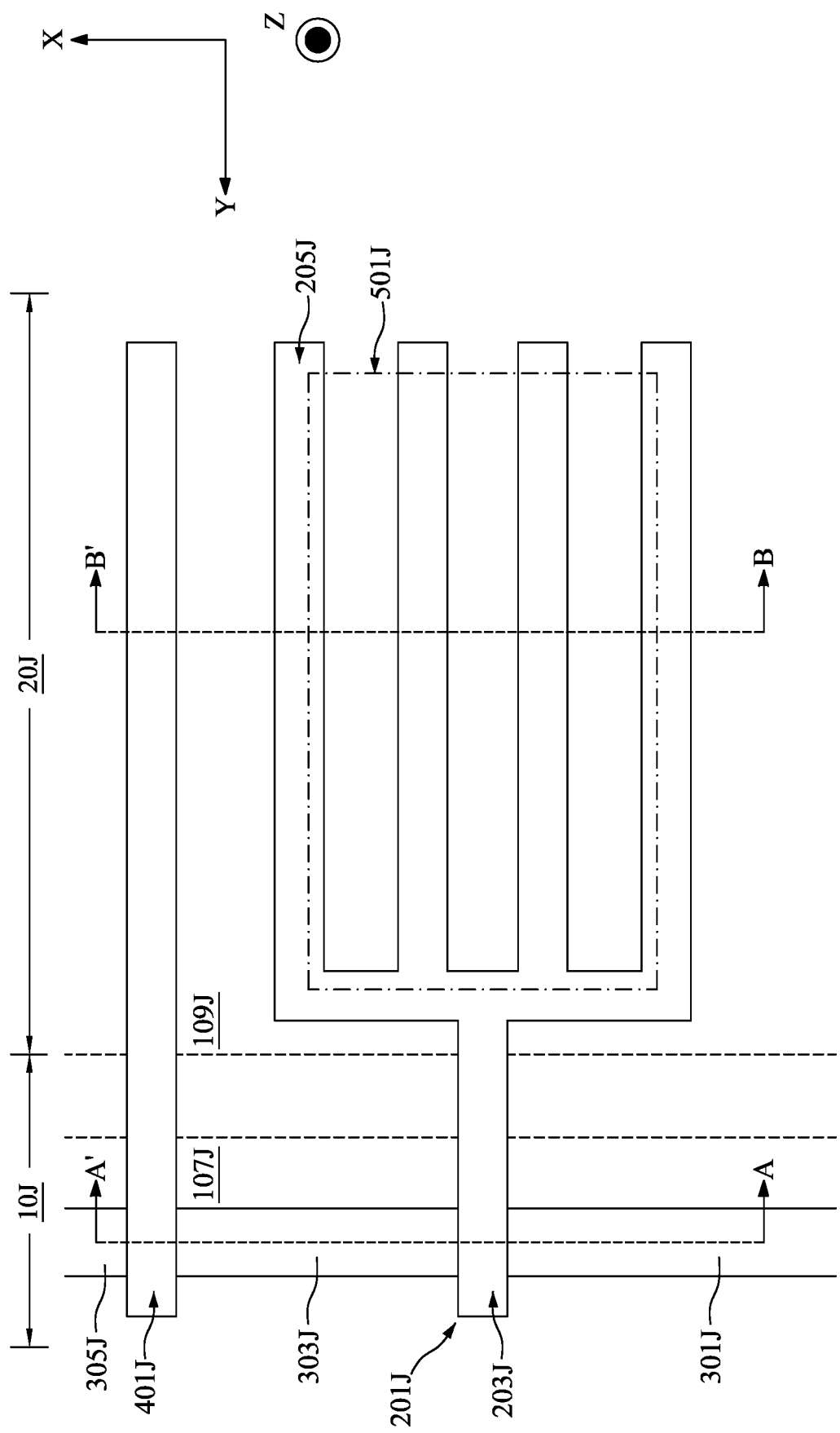
FIG. 28 illustrates, in a schematic top-view diagram, an intermediate semiconductor device in accordance with one embodiment of the present disclosure.
Figure 29:
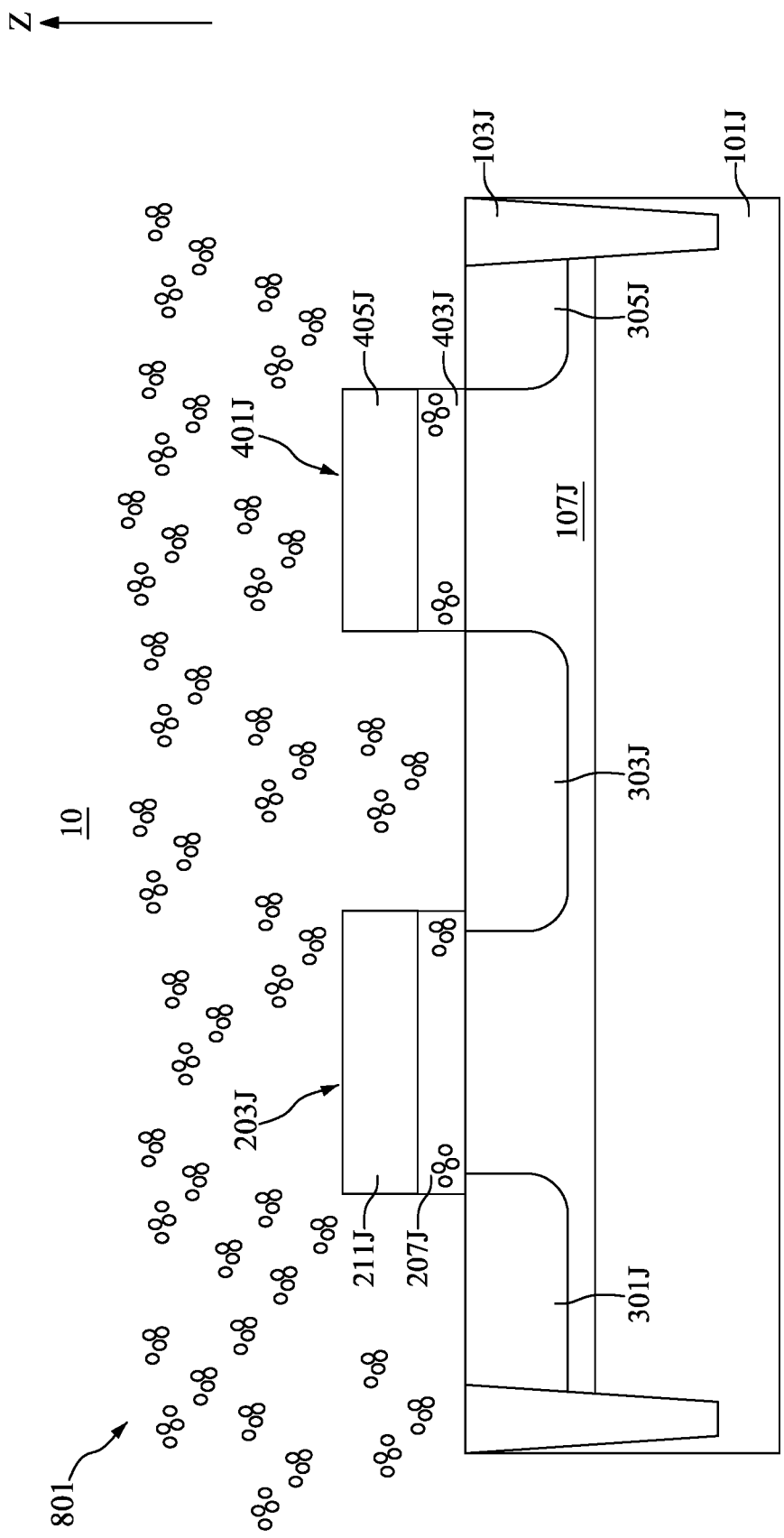
FIG. 29 is a schematic cross-sectional view diagram taken along a line A-A' in FIG. 28.
Figure 30:
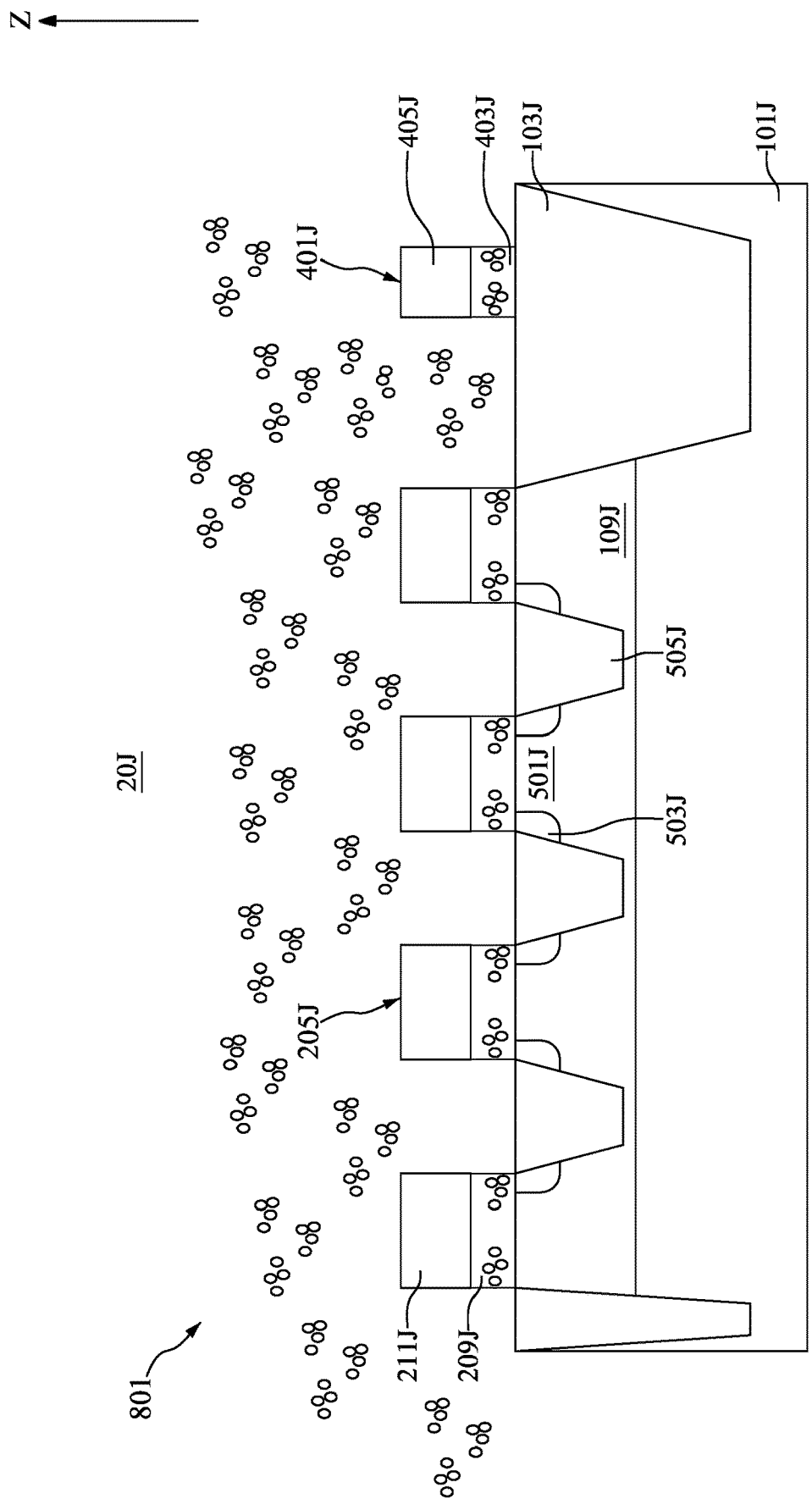
FIG. 30 is a schematic cross-sectional view diagram taken along a line B-B' in FIG. 28.

FIG. 28 illustrates, in a schematic top-view diagram, an intermediate semiconductor device in accordance with one embodiment of the present disclosure. FIG. 29 is a schematic cross-sectional view diagram taken along a line A-A' in FIG. 28. FIG. 30 is a schematic cross-sectional view diagram taken along a line B-B' in FIG. 28.

With reference to FIGS. 15 and 28 to 30, at step S15, in the embodiment depicted, a lateral oxidation process may be performed over the substrate 101J to oxidize the lateral oxidized intervention layer 209J and the tunneling insulating layer 207J. During the lateral oxidation process, the intermediate semiconductor device may be placed in an oxidizing environment including oxidizing species (indicated by groups of small circles in FIGS. 29 and 30). The oxidizing species may diffuse into the tunneling insulating layer 207J and the lateral oxidized intervention layer 209J from sidewalls thereof, and fill oxygen vacancies in the tunneling insulating layer 207J and the lateral oxidized intervention layer 209J. A process temperature of the lateral oxidation process may be between about 300° C. and about 600° C. Preferably, the process temperature of the lateral oxidation process may be between about 400° C. and about 500° C. A partial pressure of oxygen of the lateral oxidation process may be between about 100 mTorr and about 20 atm. Preferably, the partial pressure of oxygen of the lateral oxidation process may be between about 0.1 atm and about 1.0 atm. A duration of the lateral oxidation process may between about 10 minutes and about 6 hours. After the lateral oxidation process, threshold voltages of the tunneling insulating layer 207J and the lateral oxidized intervention layer 209J may be increased. The oxidizing species may be molecules including oxygen such as molecular oxygen, water vapor, nitric oxide, or nitrous oxide. The process temperature of the lateral oxidation process, the partial pressure of oxygen of the lateral oxidation process, and the duration of the lateral oxidation process may together determine an extent of oxidation of the tunneling insulating layer 207J and the lateral oxidized intervention layer 209J.

After the lateral oxidation process, a concentration of oxygen at sidewall portions of the lateral oxidized intervention layer 209J and the tunneling insulating layer 207J may be greater than a concentration of oxygen at center portions of the lateral oxidized intervention layer 209J and the tunneling insulating layer 207J. It should be noted that other partial pressures of oxygen of the lateral oxidation process that are greater than or lesser than the aforementioned partial pressure of oxygen of the lateral oxidation process may be also employed. Other durations of the lateral oxidation process that are greater than or lesser than the aforementioned duration of the lateral oxidation process may be also employed. In general, the duration of the lateral oxidation process may decrease with an increase in either the process temperature of the lateral oxidation process or the partial pressure of oxygen of the lateral oxidation process. Alternatively, in another embodiment, when a longer duration of the lateral oxidation process is applied, the concentration of oxygen at the sidewall portions and the center portion of the tunneling insulating layer 207J and the sidewall portions and the center portion of the lateral oxidized intervention layer 209J may all be increased. The concentration of oxygen at the sidewall portions of the lateral oxidized intervention layer 209J may be equal to the concentration of oxygen at the center portion of the lateral oxidized intervention layer 209J.

Figure 31:
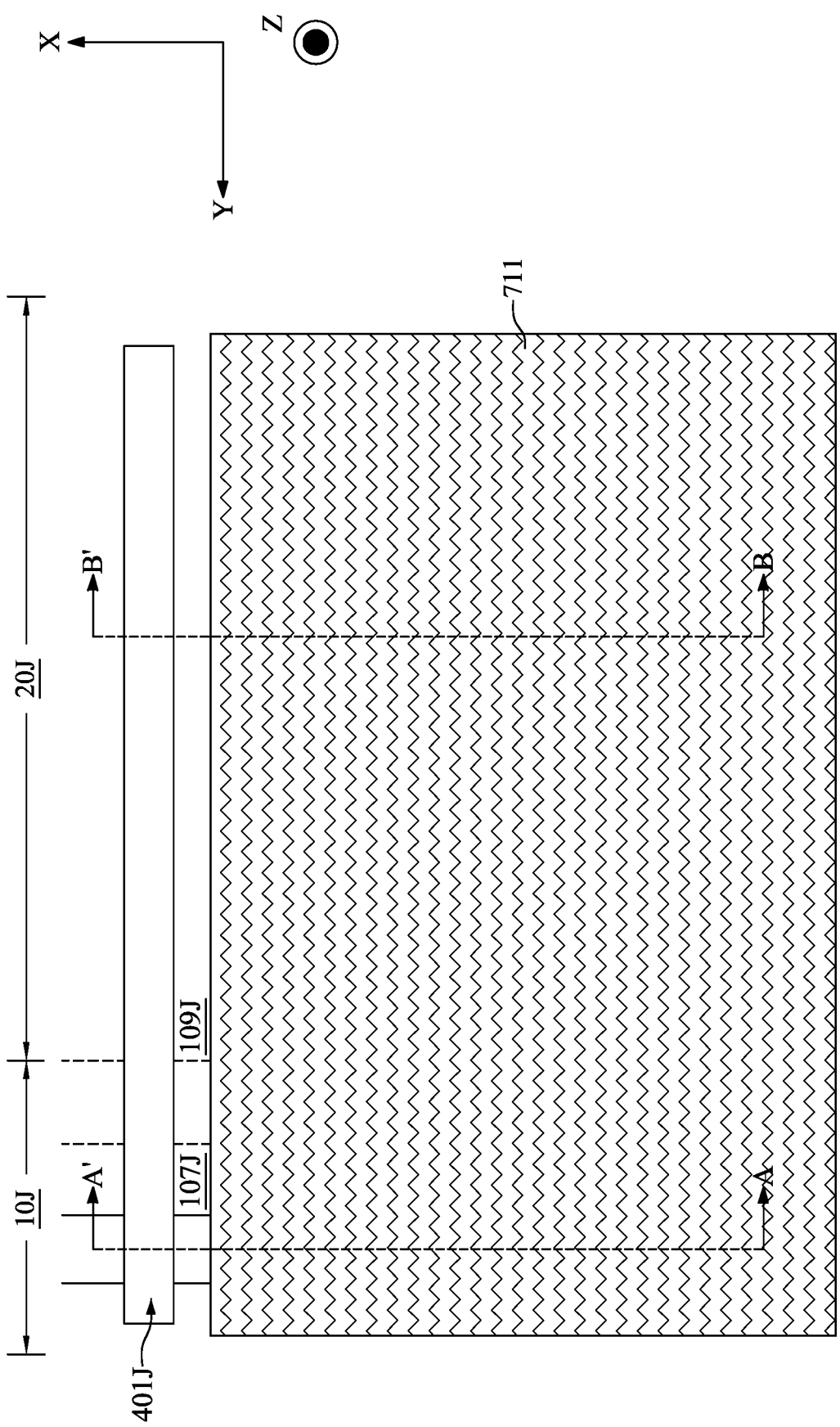
FIG. 31 illustrates, in a schematic top-view diagram, an intermediate semiconductor device in accordance with one embodiment of the present disclosure.
Figure 32:
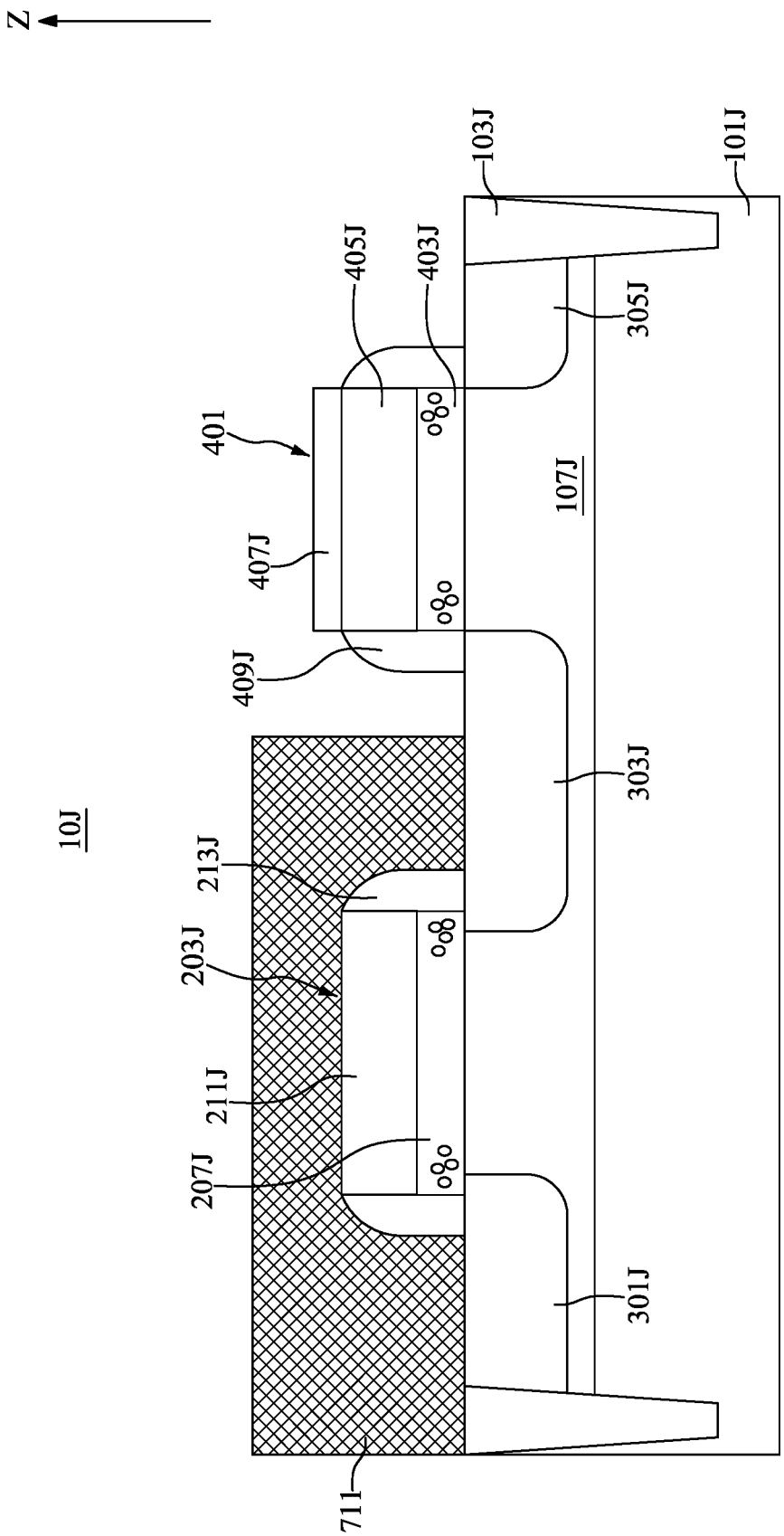
FIG. 32 is a schematic cross-sectional view diagram taken along a line A-A' in FIG. 31.
Figure 33:
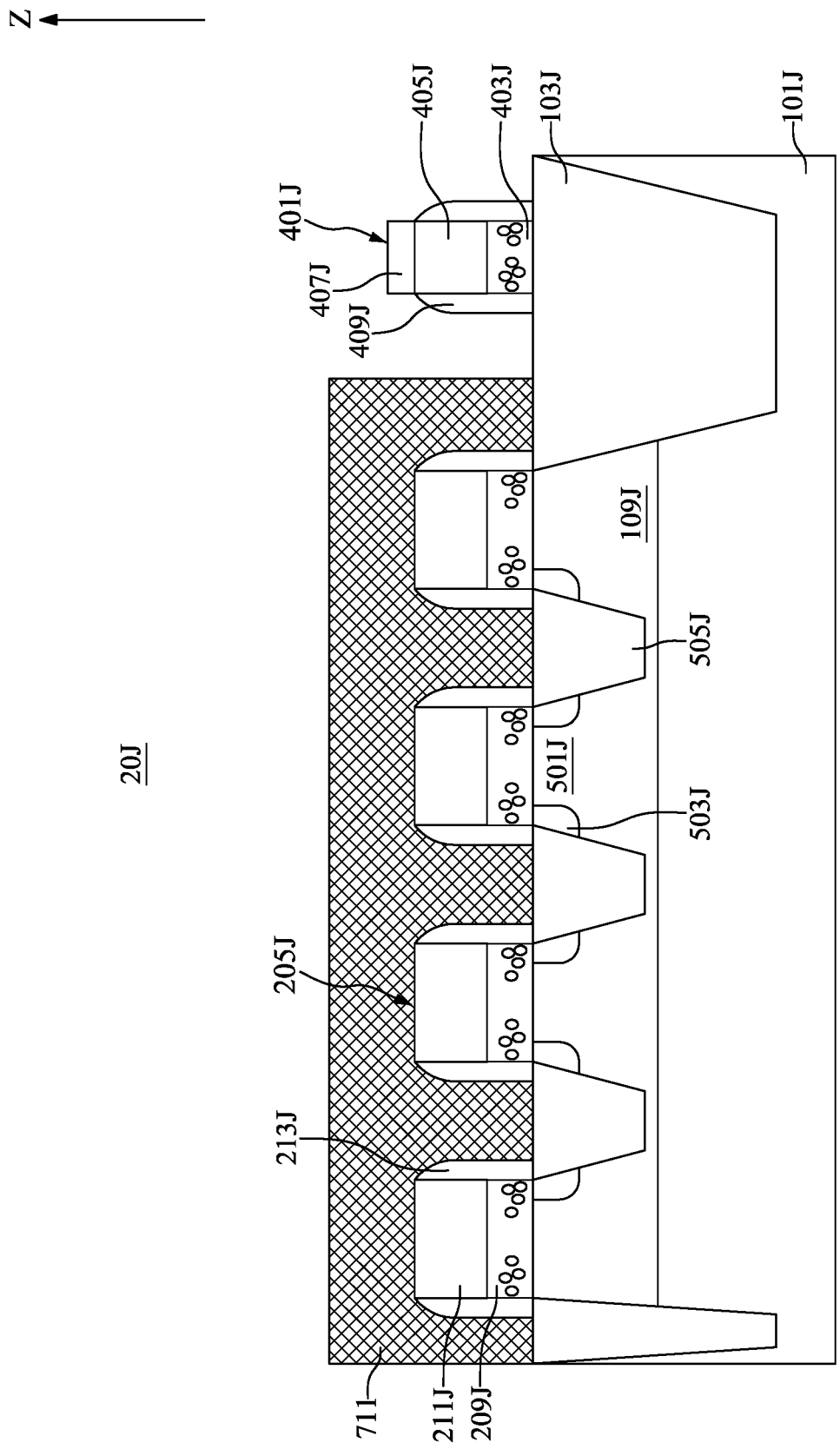
FIG. 33 is a schematic cross-sectional view diagram taken along a line B-B' in FIG. 31.

FIG. 31 illustrates, in a schematic top-view diagram, an intermediate semiconductor device in accordance with one embodiment of the present disclosure. FIG. 32 is a schematic cross-sectional view diagram taken along a line A-A' in FIG. 31. FIG. 33 is a schematic cross-sectional view diagram taken along a line B-B' in FIG. 31.

With reference to FIGS. 15 and 31 to 33, at step S17, in the embodiment depicted, a plurality of memory unit spacers 213J, a plurality of selection unit spacers 409J, and a selection unit top conductive layer 407J may be formed above the substrate 101J. A spacer layer may be formed over the substrate 101J. The spacer layer may cover top surfaces of the memory unit conductive layer 211J and the selection unit conductive layer 405J; and may cover sidewalls of the memory unit conductive layer 211J, the tunneling insulating layer 207J, the lateral oxidized intervention layer 209J, the selection unit conductive layer 405J, and the selection unit insulating layer 403J. An etch process, such as an anisotropic dry etch process, may be performed on portions of the spacer layer and may concurrently form the plurality of memory unit spacers 213J and the plurality of selection unit spacers 409J. A fourth mask layer 711 may be patterned to mask the memory unit 201. A self-aligned silicide process may be performed to form the selection unit top conductive layer 407J on the selection unit conductive layer 405J. After the self-aligned silicide process, the fourth mask layer 711 may be removed.

Figure 34:
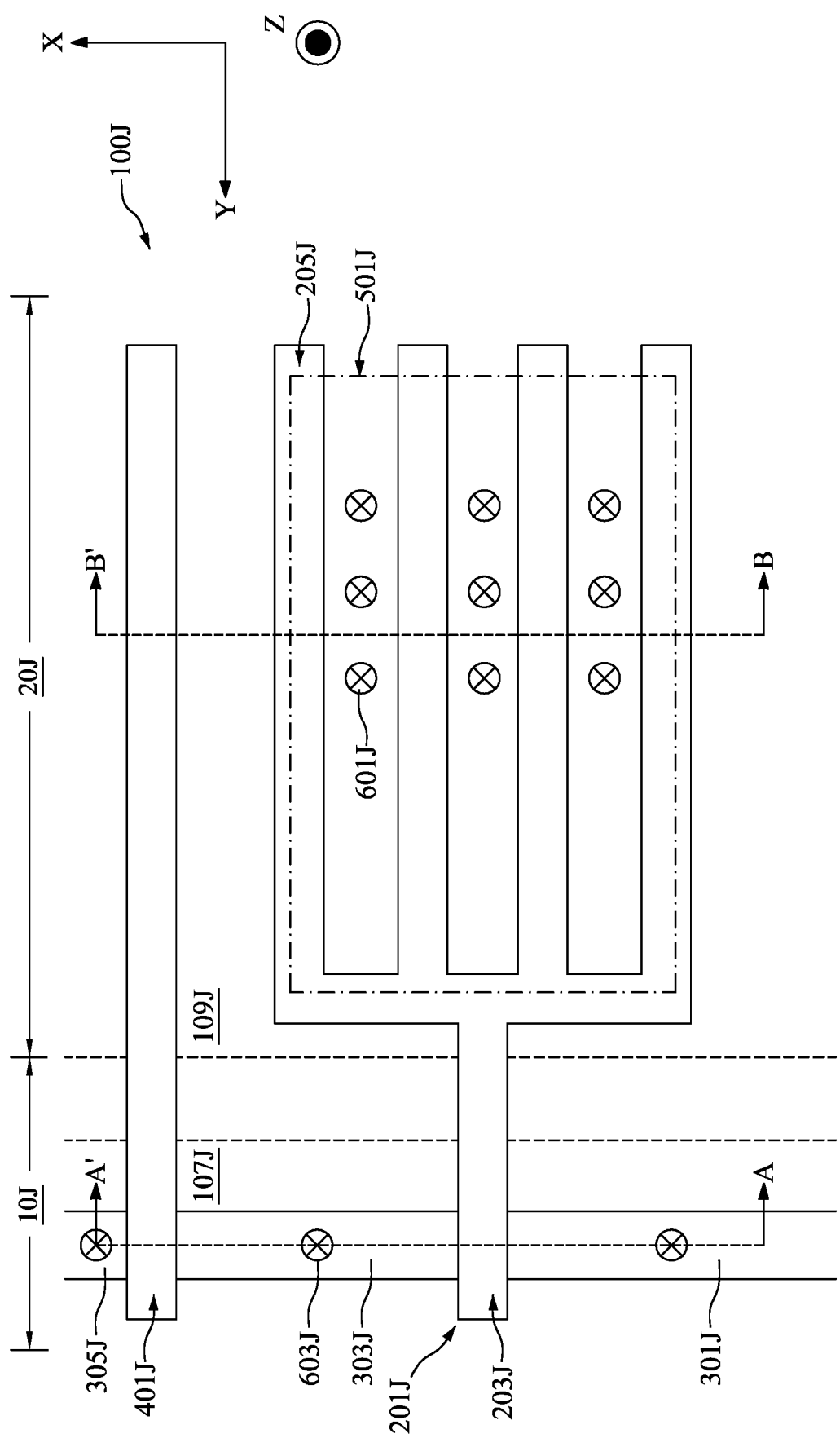
FIG. 34 illustrates, in a schematic top-view diagram, an intermediate semiconductor device in accordance with one embodiment of the present disclosure.
Figure 35:
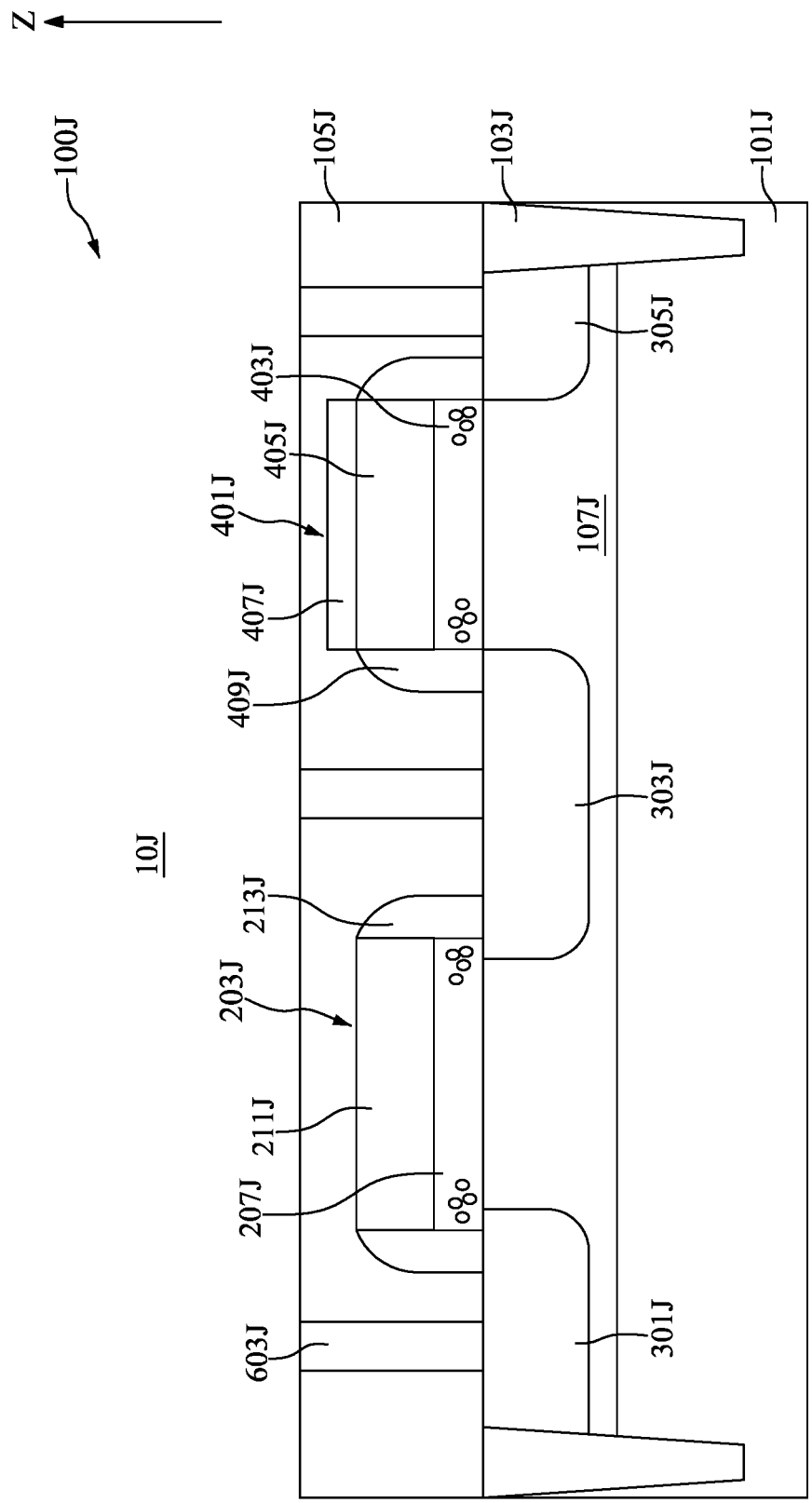
FIG. 35 is a schematic cross-sectional view diagram taken along a line A-A' in FIG. 34.
Figure 36:
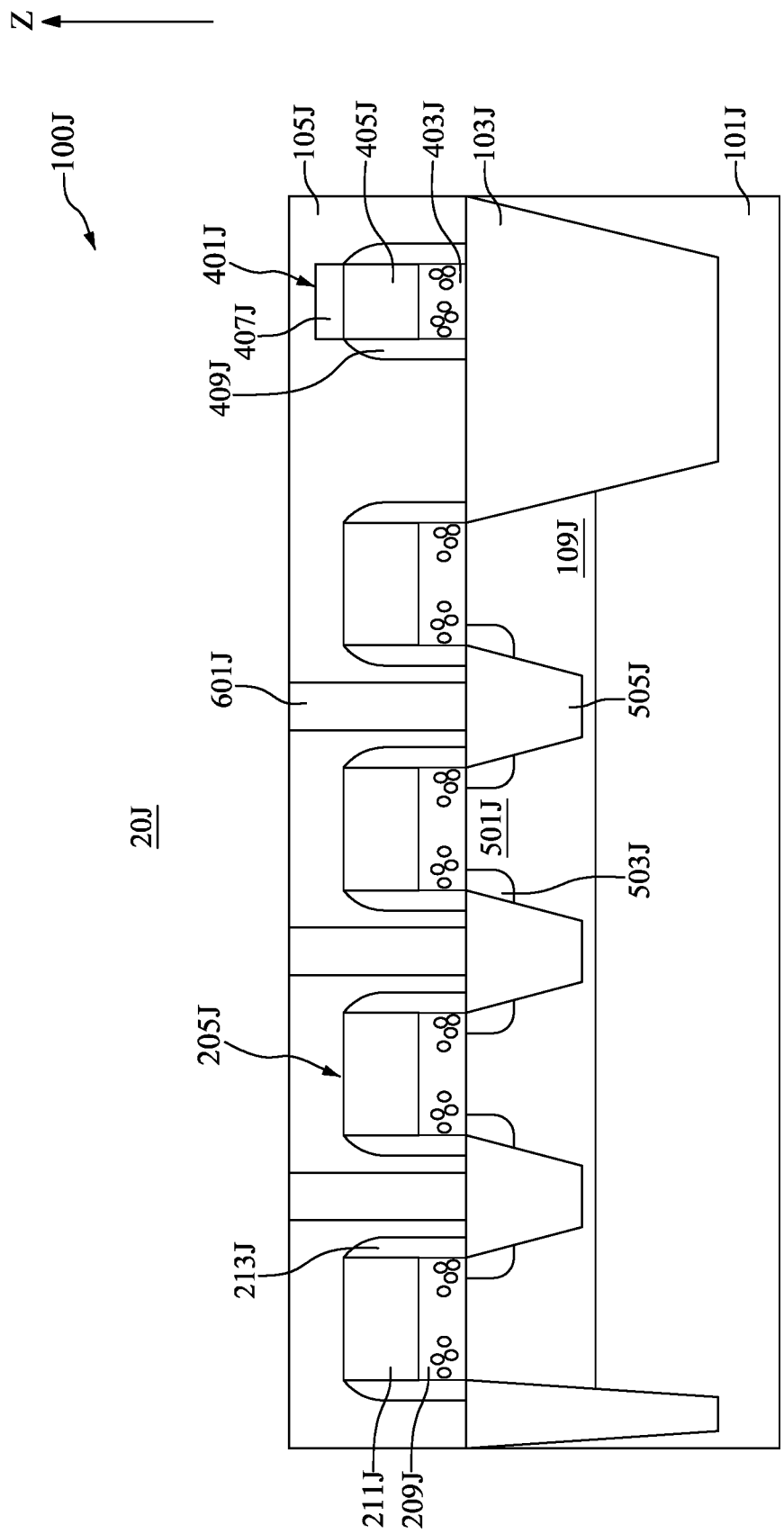
FIG. 36 is a schematic cross-sectional view diagram taken along a line B-B' in FIG. 34.

FIG. 34 illustrates, in a schematic top-view diagram, an intermediate semiconductor device in accordance with one embodiment of the present disclosure. FIG. 35 is a schematic cross-sectional view diagram taken along a line A-A' in FIG. 34. FIG. 36 is a schematic cross-sectional view diagram taken along a line B-B' in FIG. 34.

With reference to FIGS. 15 and 34 to 36, at step S19, in the embodiment depicted, a passivation insulating layer 105J may be formed on the substrate 101J, and a plurality of control contacts 601J and a plurality of doped region contacts 603J may be formed in the passivation insulating layer 105J. The passivation insulating layer 105J may be formed to cover the memory unit 201 and the selection unit 401. A planarization process, such as chemical mechanical polishing, may be performed over the passivation insulating layer 105J to provide a substantially flat surface for subsequent processing steps. The plurality of control contacts 601J may be formed on the control unit 501J and in the passivation insulating layer 105J, and the plurality of doped region contacts 603J may be formed on the plurality of doped regions and in the passivation insulating layer 105J, by a damascene process.

Due to the design of the semiconductor device 100A of the present disclosure, the dielectric constant of the lateral oxidized intervention layer 209 may be increased. As a result, the capacitive coupling between the control unit 501 and the memory unit conductive layer 211 may become more effective. Therefore, the performance of the semiconductor device 100A may be improved.

One aspect of the present disclosure provides a semiconductor device comprising a substrate; a tunneling insulating layer disposed over the substrate; a floating gate disposed over the tunnel oxide layer; a lateral oxidized intervention layer disposed over the floating gate, wherein the lateral oxidized intervention layer comprises a sidewall portion and a center portion, and the sidewall portion has a greater concentration of oxygen than the center portion; and a control gate disposed over the dielectric layer.

Another aspect of the present disclosure provides a method for fabricating a semiconductor device, comprising: providing a substrate; forming a tunneling insulating layer over the substrate; forming a floating gate over the tunnel oxide layer; forming a dielectric layer over the floating gate; forming a control gate over the dielectric layer; and performing a lateral oxidation process over the substrate, wherein a process temperature of the lateral oxidation process is between about 300° C. and about 600° C.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method for fabricating semiconductor device, comprising:
providing a substrate;
forming a tunneling insulating layer over the substrate;
forming a floating gate over the tunneling insulating layer;
forming a dielectric layer over the floating gate;
forming a control gate over the dielectric layer;
performing a lateral oxidation process over the substrate to transform the dielectric layer into a lateral oxidized intervention layer, wherein a process temperature of the lateral oxidation process is between about 300° C. and about 600° C.;
forming a plurality of doped regions in the substrate and adjacent to sides of the tunneling insulating layer;
forming a plurality of lightly-doped regions in the substrate and adjacent to sides of the lateral oxidized intervention layer;
forming a plurality of diffusion regions in the substrate and between adjacent pairs of the plurality of lightly-doped regions;
forming a first well region in the substrate, wherein the plurality of doped regions are in the first well region; and
forming a second well region in the substrate and separated from the first well region, wherein the control gate, the plurality of lightly-doped regions, and the plurality of diffusion regions are in the second well region.

2. The method of claim 1, further comprising: forming a work function metal layer between the control gate and the lateral oxidized intervention layer.

3. The method of claim 2, wherein the work function metal layer comprises titanium aluminide, zirconium aluminide, tungsten aluminide, tantalum aluminide, or hafnium aluminide.

4. The method of claim 2, wherein the work function metal layer comprises titanium nitride, tantalum nitride, titanium carbide, tantalum carbide, tungsten carbide, or aluminum titanium nitride.

5. The method of claim 1, further comprising: forming a plurality of memory unit spacers attached to the sidewall portion of the lateral oxidized intervention layer.

6. The method of claim 5, further comprising: forming a memory unit capping layer over the control gate.

7. The method of claim 5, wherein the lateral oxidized intervention layer has a thickness between 10 angstroms and about 350 angstroms.

8. The method of claim 5, wherein the tunneling insulating layer has a thickness different from a thickness of the lateral oxidized intervention layer, and the tunneling insulating layer is formed from a material different from that of the lateral oxidized intervention layer.

9. The method of claim 5, wherein the lateral oxidized intervention layer comprises a bottom lateral oxidized intervention layer over the control gate, a middle lateral oxidized intervention layer over the bottom lateral oxidized intervention layer, and a top lateral oxidized intervention layer over the middle lateral oxidized intervention layer.

* * * * *